(12) United States Patent
Ulrich et al.

(10) Patent No.: US 7,738,188 B2
(45) Date of Patent: Jun. 15, 2010

(54) PROJECTION OBJECTIVE AND PROJECTION EXPOSURE APPARATUS INCLUDING THE SAME

(75) Inventors: Wilhelm Ulrich, Aalen (DE); Aurelian Dodoc, Heidenheim (DE); Heiko Feldmann, Aalen (DE); Hans-Juergen Rostalski, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 287 days.

(21) Appl. No.: 11/727,013

(22) Filed: Mar. 23, 2007

(65) Prior Publication Data

US 2008/0037112 A1 Feb. 14, 2008

Related U.S. Application Data

(60) Provisional application No. 60/768,361, filed on Mar. 28, 2006.

(51) Int. Cl.
*G02B 13/14* (2006.01)
*G02B 17/08* (2006.01)

(52) U.S. Cl. .......................... 359/727; 359/364; 359/366

(58) Field of Classification Search ......... 359/364–366, 359/850–871, 725–732
See application file for complete search history.

(56) References Cited

U.S. PATENT DOCUMENTS

| | | | |
|---|---|---|---|
| 5,515,207 | A | 5/1996 | Foo |
| 5,636,066 | A | 6/1997 | Takahashi |
| 5,652,679 | A | 7/1997 | Freeman |
| 5,861,977 | A | 1/1999 | Harrigan et al. |
| 6,169,627 | B1 | 1/2001 | Schuster |
| 6,426,506 | B1 | 7/2002 | Hudyma |
| 6,600,608 | B1 | 7/2003 | Shafer et al. |
| 6,717,746 | B2 * | 4/2004 | Epple et al. ................. 359/727 |
| 6,757,051 | B2 | 6/2004 | Takahashi et al. |

(Continued)

FOREIGN PATENT DOCUMENTS

DE 103 32 112 A1 1/2005

(Continued)

OTHER PUBLICATIONS

M. H. Freeman, Innovative Wide-Field Binocular Design, OSA Proceedings of the International Optical Design Conference, 1994, pp. 389-393, vol. 22.

(Continued)

*Primary Examiner*—Thong Nguyen
(74) *Attorney, Agent, or Firm*—Sughrue Mion, PLLC

(57) ABSTRACT

A reduction projection objective for projection lithography has a plurality of optical elements configured to image an effective object field arranged in an object surface of the projection objective into an effective image field arranged in an image surface of the projection objective at a reducing magnification ratio $|\beta|<1$. The optical elements form a dry objective adapted with regard to aberrations to a gaseous medium with refractive index $n'<1.01$ filling an image space of finite thickness between an exit surface of the projection objective and the image surface. The optical elements include a largest lens having a maximum lens diameter $D_{max}$ and are configured to provide an image-side numerical aperture NA<1 in an effective image field having a maximum image field height Y'. With COMP=$D_{max}/(Y' \cdot (NA/n')^2)$ the condition COMP<15.8 holds.

50 Claims, 6 Drawing Sheets

U.S. PATENT DOCUMENTS

| | | | |
|---|---|---|---|
| 7,030,965 | B2 | 4/2006 | Takahashi |
| 7,079,314 | B1 | 7/2006 | Suenaga et al. |
| 7,301,605 | B2 | 11/2007 | Omura et al. |
| 7,348,575 | B2 | 3/2008 | Omura |
| 7,362,508 | B2 | 4/2008 | Omura et al. |
| 2002/0024741 | A1 | 2/2002 | Terasawa et al. |
| 2003/0011755 | A1 | 1/2003 | Omura et al. |
| 2003/0011894 | A1 | 1/2003 | Schuster |
| 2003/0197922 | A1 | 10/2003 | Hudyma |
| 2003/0197946 | A1 | 10/2003 | Omura |
| 2003/0234912 | A1 | 12/2003 | Omura |
| 2003/0234992 | A1 | 12/2003 | Shafer |
| 2004/0012866 | A1 | 1/2004 | Mann et al. |
| 2004/0109237 | A1* | 6/2004 | Epple et al. ............ 359/649 |
| 2004/0130806 | A1 | 7/2004 | Takahashi |
| 2004/0160677 | A1 | 8/2004 | Epple et al. |
| 2005/0117224 | A1 | 6/2005 | Shafer et al. |
| 2005/0190435 | A1 | 9/2005 | Shafer et al. |
| 2005/0225737 | A1 | 10/2005 | Weissenrieder et al. |
| 2007/0252094 | A1* | 11/2007 | Ulrich et al. ........ 250/492.22 |

FOREIGN PATENT DOCUMENTS

| | | |
|---|---|---|
| EP | 1 069 448 B1 | 1/2001 |
| EP | 1 318 425 A2 | 6/2003 |
| EP | 1 630 585 A1 | 3/2006 |
| JP | 2002-208551 A | 7/2002 |
| JP | 2002-372668 A | 12/2002 |
| JP | 2003/114387 A | 4/2003 |
| JP | 2004-317534 A | 11/2004 |
| JP | 2005-003982 A | 1/2005 |
| WO | WO 92/05462 A2 | 4/1992 |
| WO | WO 94/06047 A1 | 3/1994 |
| WO | WO 01/04682 A1 | 1/2001 |
| WO | WO 01/51979 A2 | 7/2001 |
| WO | WO 01/55767 A2 | 8/2001 |
| WO | WO 01/59502 A1 | 8/2001 |
| WO | WO 03/036361 A1 | 5/2003 |
| WO | WO 2004/019128 A2 | 3/2004 |
| WO | WO 2004/107011 A1 | 12/2004 |
| WO | WO 2005/040890 A2 | 5/2005 |
| WO | WO 2005/059654 A1 | 6/2005 |
| WO | WO 2005/111689 A2 | 11/2005 |

OTHER PUBLICATIONS

Tomoyuki Matsuyama et al., Nikon Projection Lens Update, Proceedings of SPIE, 2004, vol. 5377, No. 65.

Donald DeJager, Camera viewfinder using tilted concave mirror erecting elements, International Lens Design Conference (OSA), SPIE, 1980, pp. 292-298, vol. 237.

Tomoyuki Matsuyama, et al. "Microlithographic Lens for DUV Scanner", SPIE vol. 4832, Dec. 2002, Conference June 3-7, 2002, p. 170-174.

Tomoyuki Matsuyama, et al, "High NA and Low Residual Aberration Projection Lens for DUV Scanner", SPIE, vol. 4691, (2002) pp. 687-695.

Willi Ulrich et al, "Trends in Optical Design of Projection Lenses for UV-And EUV-Lithography", Proc. Of SPIE vol. 4146 (2000).

E. Glatzel, "New Lenses for Microlithography", SPIE vol. 237 (1980), p. 310-320.

Bruning, J.H., "Optical Lithography—Thirty Years and Three Orders of Magnitude", SPIE, vol. 3049, p. 14-27.

* cited by examiner

PROJECTION OBJECTIVE AND PROJECTION EXPOSURE APPARATUS INCLUDING THE SAME

This application claims the benefit of U.S. Provisional Application No. 60/786,361, filed on Mar. 28, 2006. The disclosure of this Provisional Application is incorporated herein by reference.

BACKGROUND OF THE INVENTION

1. Field of the Invention

The invention relates to a projection objective for imaging an effective object field arranged in an object surface of the projection objective onto an effective image field arranged in an image surface of the projection objective and a projection exposure apparatus including such projection objective.

2. Description of the Related Art

Projection objectives are, for example, employed in projection exposure apparatuses used for fabricating semiconductor devices and other types of micro devices and serve to project patterns on photomasks or reticles, hereinafter referred to generically as "masks" or "reticles," onto an object having a photosensitive coating with ultrahigh resolution on a reduced scale.

A projection exposure apparatus for microlithography includes an illumination system for illuminating the mask, arranged in an exit surface of the illumination system, and a projection objective, following the mask, which is designed for creating an image of the pattern of the mask in the image surface of the projection objective, where the object to be exposed is arranged. The exposure radiation provided by the projection objective is incident on the photosensitive substrate within an effective image field at an image-side numerical aperture NA of the projection objective.

For a given image-side numerical aperture NA, the size, shape and position of the effective image field correspond to an "effective geometrical light conductance value" (or "effective etendue") which is defined herein as the product of the image-side numerical aperture and the radius of a circle having minimum size including the effective image field.

It is generally desired that the projection objective has a sufficient correction status of all imaging aberrations for all field points within the effective image field in order to obtain the desired performance. The aberrations include chromatic aberrations, image curvature aberration, distortion, spherical aberrations, astigmatism etc. Outside the effective image field the correction status of imaging aberrations and/or the brightness may deteriorate such that no useful image is obtained outside the effective image field.

In the manufacture of highly integrated semiconductor devices it is often desired that at least some layers of a three dimensionally structured semiconductor device are produced at conditions where the image-side numerical aperture and the selected operating wavelength $\lambda$ of ultraviolet radiation are sufficient to obtain a relatively high resolution $R=k_1 (\lambda/NA)$, where $k_1$ is an empirical constant depending on certain process parameters. For example, resolutions R<100 nm may be required for critical layers.

The image side numerical aperture NA is limited by the refractive index of the surrounding medium in image space. In conventional "dry lithography" a space of finite thickness between an exit surface of the projection objective and the image surface is filled with a gaseous medium with refractive index n'≈1. Projection objectives designed for this process are referred to as "dry objectives" and are limited for physical reasons to values NA<1. Corresponding dry processes are well established. In contrast, immersion lithography allows to extend the processes to values NA>1. In immersion lithography the theoretically possible numerical aperture NA is limited by the refractive index of the immersion medium. The immersion medium can be a liquid (liquid immersion, "wet process") or a solid (solid immersion). Typically, the refractive index of the immersion medium is larger than 1.3.

Projection objectives optimized for high resolution typically employ operating wavelengths $\lambda$<260 nm, e.g. $\lambda$=248 nm or $\lambda$=193 nm. Since there are only few materials sufficiently transparent in that wavelength region (e.g. synthetic quartz glass (fused silica) and crystalline fluorides, such as calcium fluoride) and the Abbe numbers of those materials are close together, the correction for chromatic aberrations (color-correction) becomes difficult.

The high prices of the available materials and limited availability of crystalline calcium fluoride in sizes large enough for fabricating large lenses represent problems. Measures that will allow reducing the number and sizes of lenses and simultaneously contribute to maintaining, or even improving, imaging fidelity are thus desired.

In optical lithography, high resolution and good correction status have to be obtained for a relatively large, virtually planar effective image field. Providing a flat image requires opposing lens powers and that leads to stronger lenses, more system length, larger system glass mass, i.e. larger overall mass of the transparent material used for lenses and other transparent optical elements.

The resolution and image flatness which can be obtained in an imaging process are only two of a large number of criteria to be observed in a projection exposure process. Often it is desired to improve productivity of manufacturing processes involving the projection objective. Specifically, it may be desired for economical reasons to maximize the number of substrates which can be exposed in a given time interval, e.g. to maximize the throughput of the projection exposure process.

One contribution towards obtaining higher throughput is to use a relatively large effective image field.

The article "Optical Lithography—Thirty years and three orders of magnitude" by J. H. Bruning, SPIE vol. 3049, pages 14 to 27, describes the evolution of optical lithography tools in view of conflicting requirements regarding the resolution to be obtained and the rapid increase of substrate size to be exposed in the field of manufacturing integrated circuits. The author describes that industry moved from contact printing to projection printing in the early 1970's as the complexity of integrated circuits increased and defects became critical. After a time where full wafers where printed at 1:1 magnification, the rapid increase in wafer size was accommodated by annular field scanning using 1:1 imaging mirror systems. Further decreased linewidths requirements and overlay budgets forced the introduction of reduction "step-and-repeat" printing of small blocks of chips in the late 1970's. Further demands for smaller linewidths and larger chips have driven optical lithography to shorter wavelength and to scanning the chip in a "step-and-scan" printing mode. In both processes reduction projection objectives have been used, starting with reduction ratios of 10:1 in the mid-1970's and tending to nowadays reduction ratios of 5:1 or 4:1.

Projection objectives for a step-and-repeat process, often denoted as "stepper lens" or "stepper objective", are typically designed for a quadratic or a low aspect ratio rectangular effective image field. All-refractive (dioptric) projection objectives are often used for a step-and-repeat process. All-refractive projection objectives allow to use an effective image field centered around the optical axis. A circular area on the image side for which the projection objective must be sufficiently corrected has a diameter corresponding to a maximum image field height Y'.

Scanning systems for a reduction step-and-scan process have been developed for cases where the maximum size of the effective image field is not sufficient to cover the desired size of the area to be exposed on the substrate, e.g. the area of the chip on a wafer. Using a slit-shaped effective image field having a high aspect ratio between the widths (perpendicular to the scanning direction) and the height (in scanning direction) allows to expose larger areas on the substrate by successively exposing adjacent areas on the substrate while the mask and the substrate are moved relatively to each other in a scanning direction.

Due to the slit-shaped effective image field the maximum image field height Y' for which the projection objective must be corrected is smaller than that needed for a low aspect ratio rectangular or a quadratic effective image field having the same width, if an effective image field centered around the optical axis is used.

The maximum image field height Y' for which the projection objective must be corrected increases significantly if off-axis fields (effective object and image field arranged entirely outside the optical axis) are used. Off-axis fields are typically employed in catadioptric projection objectives where a pupil obscuration is to be avoided.

If the above requirements towards higher resolution, flat and large image field are to be met, projection objectives typically tend to become bulky requiring a large amount of transparent optical material.

SUMMARY OF THE INVENTION

It is an object of the invention to provide a reduction projection objective adapted to dry lithography at relatively high NA that can be built with relatively small amounts of transparent optical material.

As a solution to these and other objects, the invention, according to one formulation, provides a projection objective for projection lithography comprising:

a plurality of optical elements configured to image an effective object field arranged in an object surface of the projection objective into an effective image field arranged in an image surface of the projection objective;

the optical elements forming a dry objective adapted with regard to Aberrations to a gaseous medium with refractive index n'<1.01 filling an image space of finite thickness between an exit surface of the projection objective and the image surface;

the optical elements including a largest lens having a maximum lens diameter $D_{max}$;

the optical elements being configured to provide an image-side numerical aperture NA<1 in an effective image field having a maximum image field height Y'; wherein $COMP=D_{max}/(Y'\cdot(NA/n')^2)$ and wherein the following condition holds:

COMP<15.8.

Generally, the dimensions of dry projection objectives adapted with regard to aberrations to a gaseous medium with refractive index n'≈1 filling an image space of finite thickness between an exit surface of the projection objective and the image surface, tend to increase dramatically as the image side numerical aperture NA is increased. Empirically it has been found that the maximum lens diameter $D_{max}$ tends to increase stronger than linear with increase of NA according to $D_{max} \sim (NA/n')^k$, where k>1. A value k=2 is an approximation used for the purpose of this application. Further, it has been found that the maximum lens diameter $D_{max}$ increases in proportion to the image field size (represented by the image field height Y'). A linear dependency is assumed for the purpose of the application. Based on these considerations a compactness parameter COMP is defined as:

$$COMP=D_{max}/(Y'\cdot(NA/n')^2).$$

It is evident that, for given values of image field height and numerical aperture, the compactness parameter COMP should be as small as possible if a compact design is desired. According to the above aspect of the invention, COMP<15.8.

In some embodiments, at least one of the conditions COMP<15 and COMP<14 is fulfilled.

Some embodiments have an image-side numerical aperture NA>0.8 enabling very high resolution when used with ultraviolet light from the DUV region such as λ=193 nm or λ 248 nm. In some embodiments at least one of the conditions NA>0.85 and NA>0.9 holds.

At the same time, the maximum lens diameter $D_{max}$ can be kept at a moderate value such that the condition $D_{max}/NA<240$ mm holds. In some embodiments, even smaller values are obtained, such as $D_{max}/NA<230$ mm or $D_{max}/NA<220$ mm or $D_{max}/NA<210$ mm.

In some embodiments, the largest lens (lens having the maximum lens diameter $D_{max}$) is arranged in an image-side objective part imaging a last intermediate image onto the image surface. For example, in projection objectives having three objective parts and exactly two intermediate images, the lens with the largest lens diameter $D_{max}$ may be arranged in a third objective part imaging a second intermediate image onto the image surface. The largest lens may be positioned in a lens group between a last intermediate image and a pupil surface of the last objective part (pupil surface closest to the image surface) of the projection objective. Specifically, the largest lens may be positioned directly adjacent and downstream of a second intermediate image.

In some embodiments, the largest lens (lens having a maximum lens diameter $D_{max}$) may be provided in a lens group designed to Fourier transform radiation from a last pupil surface (pupil surface closest to the image surface) of the projection objective onto the image surface, thereby contributing to forming the large image side NA.

In order to avoid large maximum values for a lens diameter it may be useful to configure the projection objective such that the projection objective has at least one intermediate image. In those designs, an objective part upstream of the intermediate image forms the intermediate image, which is then imaged by at least one subsequent objective part downstream of the intermediate image onto the image surface. The projection objective may be all-refractive such that all optical elements having optical power are transparent to the operating wavelength.

One approach for obtaining a flat image surface and good color-correction is the use of catadioptric systems, which combine both refracting elements, such as lenses, and reflecting elements, such as mirror, preferably including at least one concave mirror. While the contributions of positive-powered and negative-powered lenses in an optical system to overall power, surface curvature and chromatic aberrations are opposite to each other, a concave mirror has positive power like a positive-powered lens, but the opposite effect on surface curvature without contributing to chromatic aberrations. Therefore, in some embodiments, the optical elements include at least one concave mirror to form a catadioptric projection objective.

Considering the overall material consumption necessary for Providing lenses for a projection objective, the absolute number of lenses, $N_L$, may also be relevant. Typically, systems with a smaller number of lenses will be preferred to systems with a larger number of lenses. In some embodiments the condition $N_L$<20 holds for the total number $N_L$ of lenses of projection objective.

Employing at least one concave mirror may be used to significantly reduce the number of transparent lenses necessary to obtain a desired specification with regard to aberrations. In preferred embodiments the condition $N_L$<20 holds for the number $N_L$ of transparent lenses of the projection objective. Some embodiments may have only nineteen or eighteen or seventeen lenses. In some embodiments $N_L \leqq 16$. For example $N_L$=15 or $N_L$=14. Smaller numbers may be possible.

Reducing the number of lenses is beneficial for several reasons. Firstly, the total mass of lenses may be reduced significantly when compared to all-refractive (dioptric) systems having comparable image field size and NA. Secondly, as each optical surface within an optical system generates reflection losses, a reduction in a total number of optical surfaces may be beneficial from the transmission point of view to obtain "brighter" projection objectives whereby exposure time can be reduced and, as a consequence, throughput of exposed substrates can be increased. Thirdly, the number of lens surfaces should be kept small since at each surface, a portion of the electro magnetic energy is absorbed and leads to a heating of the optical material. This has impact to imaging quality.

In some embodiments it has been found useful to provide a relatively large number of aspheric lenses, which can be designed to both reduce the overall number of lenses and to contribute to aberration correction. In preferred embodiments, the projection objective has a number $N_L$ of lenses, a number $N_{ASP}$ of aspheric lenses and the condition AR>0.33 holds for the asphere ratio AR=$N_{ASP}/N_L$. Here an aspheric lens is a lens where at least one of the two lens surfaces is a non-spherical (aspheric) lens surface. Preferably, AR>0.66 and/or AR$\geqq$0.75.

Projection objectives including at least one concave mirror may be Designed to have an effective image field (and effective object field) centered around the optical axis (on-axis system). To this end, a physical beam splitter, such as a beam splitter having a polarization selective beam splitter surface, may be used to separate radiation guided to and reflected from a concave mirror. Also, systems having a central pupil obscuration may be used if a centered effective image field is desired.

As systems with physical beam splitter may be difficult to handle in terms of polarization control and since central pupil obscuration may not be desired, alternative catadioptric designs having an effective object field and effective image field arranged outside the optical axis (off-axis systems) may be used. These systems may be subdivided into designs using geometrical beam splitting with one or more planar folding mirrors, and systems without folding mirrors, e.g. so called "in-line systems" having one straight (unfolded) optical axis common to all optical elements. In these off-axis systems, effective fields (object field and image field) positioned entirely outside the optical axis are used to avoid vignetting. Both rectangular effective image fields and effective image fields having an arcuate shape, typically denoted as "annular field" or "ring field" may be used.

One single concave mirror may be sufficient in some embodiments. In other embodiments more than one concave mirror is used. In this case, further degrees of freedom with regard to correction of aberrations are obtained. Preferably, the optical elements include an even number of concave mirrors. In this case, the projection objective may be designed as an in-line system having one straight optical axis common to all optical elements. No planar folding mirrors are necessary, thereby avoiding e.g. polarization effects introduced by planar folding mirrors. Projection objectives having exactly two concave mirrors facing each other may be favorable since a parallel alignment of object surface and image surface and a straight optical axis can be obtained with a minimum number of concave mirrors. Designs with more than two concave mirrors, e.g. three, four, five or six concave mirrors are also possible.

Catadioptric projection objectives designed for imaging the image field directly, e.g. without intermediate image, onto the image surface may be used. Preferred embodiments have at least one (real) intermediate image. Providing at least one intermediate image allows higher flexibility with regard to correction of imaging aberrations, since the correction of aberrations may be obtained by compensating effects of more than one imaging objective part.

Some embodiments include a first, refractive objective part for imaging the pattern provided in the object surface into a first intermediate image; a second objective part including at least one concave mirror for imaging the first intermediate image into a second intermediate image; and a third, refractive objective part for imaging the second intermediate image onto the image surface. The first refractive objective part allows to create the first intermediate image having a desired position, size and corrections status. These parameters can be adjusted such that favorable imaging by the catoptric or catadioptric second objective part into the second intermediate image is possible. The third, refractive objective part may be optimized to compensate residual aberrations of the second intermediate image and to provide the desired image-side numerical aperture NA and effective image field size.

The second objective part may be catoptric (consisting of mirrors only) or catadioptric, combining a concave mirror with at least one lens. For example, one or more negative lenses may be placed in front of a concave mirror situated close to or at the pupil surface of the second objective part to provide a major contribution to color correction. The second objective part may include one concave mirror only. In preferred embodiments, a first concave mirror having a first continuous mirror surface and at least one second concaved mirror having a second continuous mirror surface are arranged in the second objective part. Preferably, pupil surfaces are formed between the object surface and the first intermediate image, between the first and the second intermediate image and between the second intermediate image and the image surface; and all concave mirrors are arranged optically remote from a pupil surface. Ultra-high resolution catadioptric projection objectives of this general construction adapted to immersion lithography at NA>1 are disclosed e.g. in US 2005/0190435A1 by the applicant. The disclosure of this document is incorporated herein by reference.

In some embodiments, the first objective part, i.e. the objective part immediately following the object surface and forming an intermediate image, includes no lens with negative refractive power. Axially compact construction is thereby obtained between the object surface and the first intermediate image. In some embodiments the first objective part has exclusively lenses with positive refractive power. The first objective part may include at least one biconvex positive lens. In some embodiments, at least two biconvex positive lenses are arranged in the first objective part, such as two or three biconvex positive lenses. Concentrating positive power in biconvex lenses contributes to reducing the number of lenses within the first objective part. In some embodiments, the first objective part has five or less lenses with positive refractive power. For example, the first objective part may have four lenses with positive refractive power and no lens with negative refractive power.

The projection objective may have about unit magnification, i.e. ($|\beta|=1.0$ or close to 1:1). Some embodiments are reduction projection objectives having a plurality of optical elements configured to image an effective object field arranged in an object surface of the projection objective into an effective image field arranged in an image surface of the projection objective at a reducing magnification ratio $|\beta|<1$. In order to allow printing relatively fine structures on the image-side from relatively coarse structures on the object-side of the projection objective, some embodiments have a magnification ratio significantly smaller than 2:1 ($|\beta|=0.5$). For example, $|\beta| \leq 0.25$ in some embodiments.

According to another aspect of the invention, there is provided a catadioptric projection objective for projection lithography comprising:

a plurality of optical elements configured to image an effective object field arranged in an object surface of the projection objective into an effective image field arranged in an image surface of the projection objective;

the optical elements forming a dry objective adapted with regard to aberrations to a gaseous medium with refractive index n'<1.01 filling an image space of finite thickness between an exit surface of the projection objective and the image surface;

the optical elements forming:

a first objective part configured to image the pattern provided in the object surface into a first intermediate image;

a second objective part including at least one concave mirror configured to image the first intermediate image into a second intermediate image;

a third objective part configured to image the second intermediate imaging onto the image surface; wherein:

the projection objective has a maximum lens diameter $D_{max}$, a maximum image field height Y', and an image side numerical aperture NA<1; wherein $$COMP=D_{max}/(Y \cdot (NA/n')^2)$$

and wherein the following condition holds $$COMP<18.$$

The previous and other properties can be seen not only in the claims but also in the description and the drawings, wherein individual characteristics may be used either alone or in sub-combinations as an embodiment of the invention and in other areas and may individually represent advantageous and patentable embodiments.

DETAILED DESCRIPTION OF THE PREFERRED EMBODIMENTS

In the following description of preferred embodiments of the invention, the term "optical axis" shall refer to a straight line or sequence of straight-line segments passing through the centers of curvature of the optical elements. In the case of those examples presented here, the object is either a mask (reticle) bearing the pattern of an integrated circuit or some other pattern, for example, a grating pattern. In the examples presented here, the image of the object is projected onto a wafer serving as a substrate that is coated with a layer of photoresist, although other types of substrate, such as components of liquid-crystal displays or substrates for optical gratings, are also feasible.

The terms "front" and "rear" as well as the terms "upstream" and "downstream" relate to relative positions along the optical path, where "front" and "upstream" relate to positions optically closer to the object surface in a projection objective.

Where tables are provided to disclose the specification of a design shown in a figure, the table or tables are designated by the same numbers as the respective figures. Corresponding features in the figures are designated with like or identical reference identifications to facilitate understanding. Where lenses are designated, an identification L3-2 denotes the second lens in the third objective part (when viewed in the light propagation direction).

Figure 1:
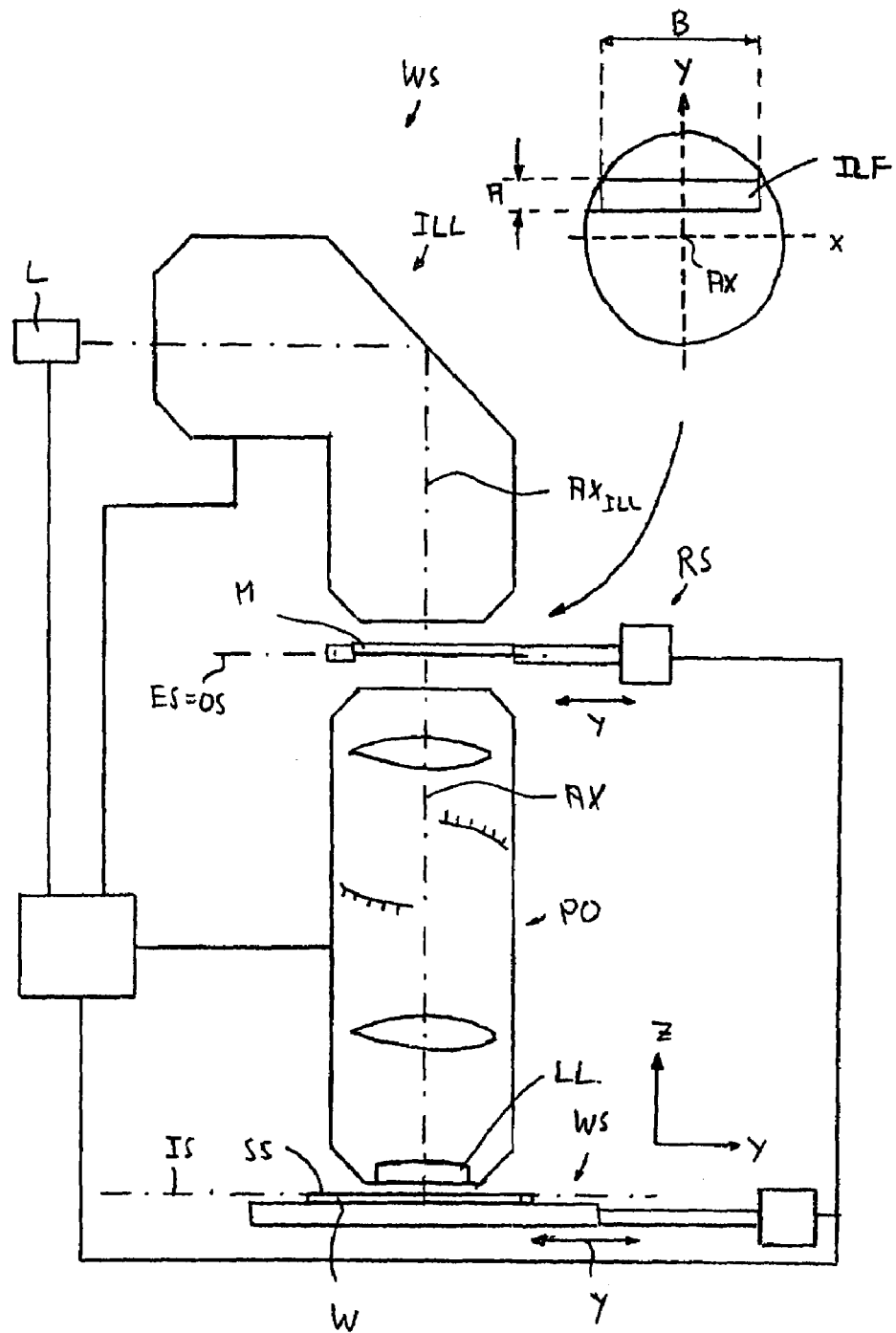
FIG. 1 shows a schematic drawing of a projection exposure apparatus for microlithography having an illumination system designed for creating an off-axis illumination field and a catadioptric projection objective according to an embodiment of the invention.

FIG. 1 shows schematically a microlithographic projection exposure apparatus in the form of a wafer scanner WS, which is provided for fabricating large scale integrated semiconductor components in a step-and-scan mode. The projection exposure apparatus comprises as light source an ArF excimer laser L having an operating wavelength of about 193 nm. Other operating wavelengths, for example around 365 nm (g-, h- and i-line of a Hg arc lamp), or 248 nm are also possible in other embodiments. A downstream illumination system ILL generates, in its exit surface ES, a large, sharply delimited, homogeneously illuminated illumination field ILF that is adapted to the telecentric requirements of the downstream catadioptric projection objective PO. The illumination system ILL has devices for selection of the illumination mode and, in the example, can be changed over between conventional on-axis illumination with a variable degree of coherence, and off-axis illumination, particularly annular illumination (having a ring shaped illuminated area in a pupil surface of the illumination system) and dipole or quadrupole illumination.

Arranged downstream of the illumination system is a device RS (reticle stage) for holding and manipulating a mask M in such a way that a pattern formed on the mask lies in the exit surface ES of the illumination system coinciding with the object surface OS of the projection objective PO and can be moved in this plane for a scanning operation in a scanning direction (Y-direction) perpendicular to the optical axis $AX_{ILL}$ of the illumination system and to the coaxial optical axis AX of projection objective (i.e. the Z-direction).

The reduction projection objective PO is designed to image an image of a pattern provided by the mask with a reduced scale (magnification ratio $|\beta|<1$) onto a wafer W coated with a photoresist layer. For example, $|\beta|<0.5$, such as $|\beta|=0.25$. The wafer W serving as a light-sensitive substrate is arranged in such a way that the planar substrate surface SS with the photoresist layer essentially coincides with the planar image surface IS of the projection objective. The wafer is held by a device WS (wafer stage) comprising a scanner drive in order to move the wafer synchronously with the mask M in parallel with the latter. The device WS also comprises manipulators in order to move the wafer both in the Z direction parallel to the optical axis AX and in the X and Y directions perpendicular to said axis. A tilting device having at least one tilting axis running perpendicular to the optical axis is integrated.

The projection objective PO has a planoconvex last lens LL as the last optical element nearest to the image surface IS, the planar exit surface of said last lens being the last optical surface (exit surface) of the projection objective PO. In other embodiments the last lens may have a different shape. The projection objective PO is a "dry objective" adapted with regard to aberrations to a gaseous medium with refractive index n'≈1, for example n'<1.01, filling an image space of finite thickness between the exit surface of the projection objective and the image surface. During operation of the projection exposure apparatus, a gas filled gap is formed between the exit surface of the last optical element and the substrate surface SS.

As shown schematically in the inset figure of FIG. 1, the illumination system ILL is capable of generating an illumination field ILF having a rectangular shape. The position, size and shape of the illumination field determine the position, size and shape of the effective object field OF and the effective image field IF of the projection objective actually used in the projection process. The illumination field ILF does not include the optical axis (off-axis illumination field), has a height A parallel to the scanning direction (Y-direction) and a width B perpendicular to the scanning direction and an aspect ratio AR=B/A of about 26:5.5. Other aspect ratios are possible, for example $20 \geqq AR \geqq 1$.

Figure 2:
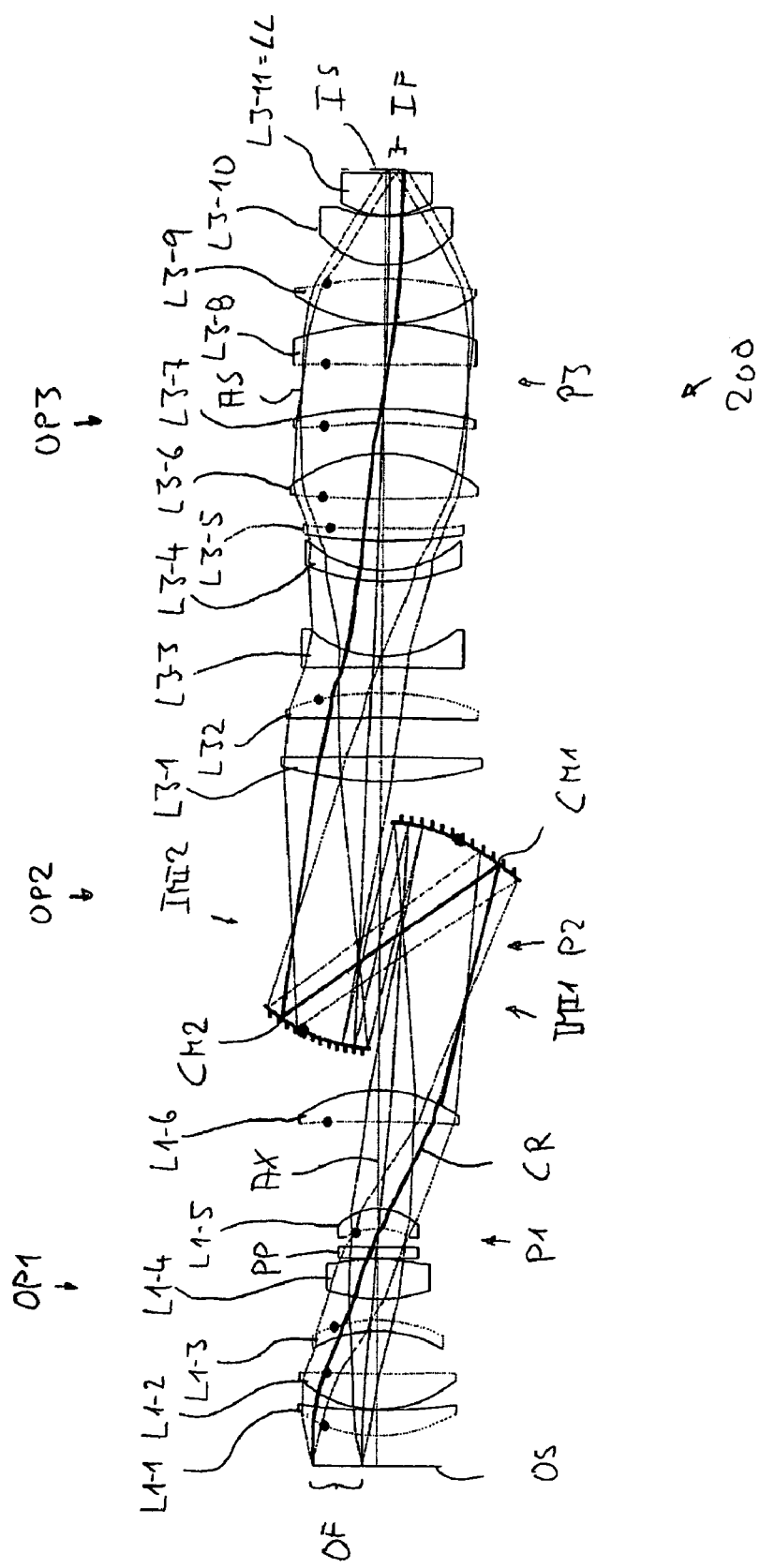
FIG. 2 shows a meridional lens section of a first embodiment of a catadioptric reduction projection objective according to the invention.

FIG. 2 shows an embodiment of a catadioptric projection objective 200 according to the invention designed for an approximately 193 nm UV working wavelength. It is designed to project an image of a pattern on a reticle (mask) arranged in the planar object surface OS (object plane) into the planar image surface IS (image plane) on a reduced scale 4:1, while creating exactly two real intermediate images IMI1, IMI2. A first refractive objective part OP1 is designed for imaging the pattern in the object surface into the first intermediate image IMI1 at an enlarged scale. A second, catoptric (purely reflective) objective part OP2 images the first intermediate image IMI1 into the second intermediate image IMI2 at a magnification close to 1:1. A third, refractive objective part OP3 images the second intermediate image IMI2 onto the image surface IS with a reduction ratio of about 5:1. An aperture stop AS is placed in the third objective part in the region of the pupil surface P3 thereof.

An off-axis effective object field OF positioned outside the optical axis AX is projected on an off-axis image field IF. The trajectory of a chief ray CR of an outer field point of the off-axis object field OF in the meridional plane (drawing plane) is drawn bold in order to facilitate following the beam path. For the purpose of this application, the term "chief ray" (also known as principal ray) denotes a ray emanating from an outermost field point (farthest away from the optical axis) of the effectively used object field OF and intersecting the optical axis at least one pupil surface position. Here, three pupil surfaces P1, P2 and P3 are formed, one pupil surface in each objective part. In projection objectives being essentially telecentric on the object side (as in the embodiment), the chief ray emanates from the object surface parallel or at a very small angle with respect to the optical axis. As evident from the figure, the chief ray intersects both the object surface and the image surface essentially at right angles indicating both object-side and image-side telecentricity. The imaging process is further characterized by the trajectory of marginal rays. A "marginal ray" as used herein is a ray running from an axial object field point (on the optical axis) to the edge of an aperture stop AS. That marginal ray may not contribute to image formation due to vignetting when an off-axis effective object field is used. The chief ray and marginal ray are chosen to characterize optical properties of the projection objective.

The first, refractive objective part OP1 includes, in this order starting from the object surface, a positive meniscus lens L1-1 having an aspheric entry surface and a spherical concave exit surface, a positive meniscus lens L1-2 having spherical entry surface and aspherical concave exit surface, a thin meniscus lens L1-3 concave towards the object side having an aspheric exit surface, a biconvex, bispherical positive lens L1-4, an optionally exchangeable plane parallel plate PP without refractive power, immediately adjacent to the first pupil surface P1, a positive meniscus lens L1-5 having concave, aspherical entry surface and a positive meniscus lens L1-6 having concave, aspherical entry surface and spherical exit surface immediately adjacent to the first intermediate image. The optical effect of the plane parallel plate PP on the projection beam passing plate at obliged angles is considered in the overall correction of the projection objective. At least one of the planar surfaces may be provided with an aspheric surface figure to contribute to optical correction. Since the correcting element formed by the parallel plate PP is arranged immediately adjacent to the pupil surface P1, the correcting effect of the correcting element will be essentially the same for all field points.

The second objective part OP2 comprises a first concave mirror CM1 having the aspherical concave mirror surface facing the object side, and a second concave mirror CM2 having the aspherical concave mirror surface facing the image side. The mirror surfaces are both continuous or unbroken, i.e. they do not have a hole or bore in the area used for reflection. The mirror surfaces facing each other define a catadioptric cavity, which is also denoted intermirror space, enclosed by the curved surfaces defined by the concave mirrors. The intermediate images IMI1, IMI2 (at least the paraxial parts thereof) are both situated inside the catadioptric cavity well apart from the mirror surfaces.

Each mirror surface of a concave mirror defines a "curvature surface" or "surface of curvature" which is a mathematical surface extending beyond the edges of the physical mirror surface and containing the mirror surface. The first and second concave mirrors are parts of rotationally symmetric curvature surfaces having a common axis of rotational symmetry coinciding with the optical axis defined by the first and third objective parts (in-line system).

The third, refractive objective part OP3 has, in this order between the second intermediate image IMI2 and the image surface IS, a biconvex positive lens L3-1 immediately following the second intermediate image, a positive meniscus lens L3-2 having convex, aspheric exit surface, a bispherical, biconcave negative lens L3-3 with strong negative power and strongly curved exit surface, a negative meniscus lens L3-4 concave towards the image-side, a thin positive meniscus lens L3-5 having aspheric exit side, a biconvex positive lens L3-6 aspheric on the entry side, a thin meniscus lens L3-7 concave towards the object-side and aspheric on the entry side immediately upstream of the aperture stop AS, a positive lens L3-8 having almost planar aspheric entry surface facing the third pupil surface P3, a biconvex positive lens L3-9 having aspheric exit surface, a bispherical positive meniscus lens L3-10 concave towards the image surface, and a plano-convex lens L3-10 having a spherical, curved entry surface and a planar exit surface forming the exit surface of the projection objective. An image-side working distance of about 3 mm is filled with a gas during operation of the projection objective. Plano-convex lens L3-11 forms the last lens LL of the projection objective.

Biconvex positive lens L3-1 immediately following the second intermediate image IMI2 forms the largest lens ($D_{max}$=191.40 mm). With Y'=15.83 mm and NA=0.88 the conditions COMP=15.613 and $D_{max}$/NA=217.5 hold.

The objective 200 is rotational symmetric and has one straight optical axis AX common to all refractive and reflective optical components. There are no folding mirrors. The concave mirrors have small diameters allowing to bring them close together and rather close to the intermediate images lying in between. The concave mirrors are both constructed and illuminated as off-axis sections of axial symmetric surfaces. The light beam passes by the edges of the concave mirrors facing the optical axis without vignetting. The exit pupil is circular without obscuration and is centered about the optical axis.

The projection objective 200 is designed as a "dry objective" for λ=193 nm having a maximum image side numerical aperture NA=0.88 in an off-axis effective image field with height A'=5.5 mm and width B'=26.5 mm. The total track length (axial distance between object surface and image surface) is 1200 mm. The optical correction for aberrations is characterized by a root-mean-square (RMS) of the wavefront error equal to a smaller than 10 mλ for all image heights. All lenses are made of fused silica. Typical resolutions of R≦120 nm can be obtained.

The specification for this design is summarized in Table 2. The leftmost column lists the number of the refractive, reflective, or otherwise designated surface, the next column lists the radius (of curvature), r, of that surface [mm], the next column indicates the aspherical surfaces "AS", the next column lists the distance, d [mm], between that surface and the next surface, a parameter that is referred to as the "thickness" of the optical element, the next column lists the refractive index of the material employed for fabricating that optical element, and the next colunm lists the optically utilizable, clear, semi diameter [mm] of the optical component. A radius of curvature r=0 in a table designates a planar surface (having infinite radius).

In this embodiment, 13 surfaces (marked by dots in FIG. 2) are aspherical surfaces. Table 2A lists the associated data for those aspherical surfaces, from which the sagitta or rising height p(h) of their surface figures as a function of the height h may be computed employing the following equation:

$$p(h)=[((1/r)h^2)/(1+SQRT(1-(1+K)(1/r)^2h^2))]+C1 \cdot h^4+C2 \cdot h^6+\ldots,$$

where the reciprocal value (1/r) of the radius is the curvature of the surface in question at the surface vertex and h is the distance of a point thereon from the optical axis. The sagitta or rising height p(h) thus represents the distance of that point from the vertex of the surface in question, measured along the z-direction, i.e., along the optical axis. The constants K, C1, C2, etc., are listed in Table 2A.

Figure 3:
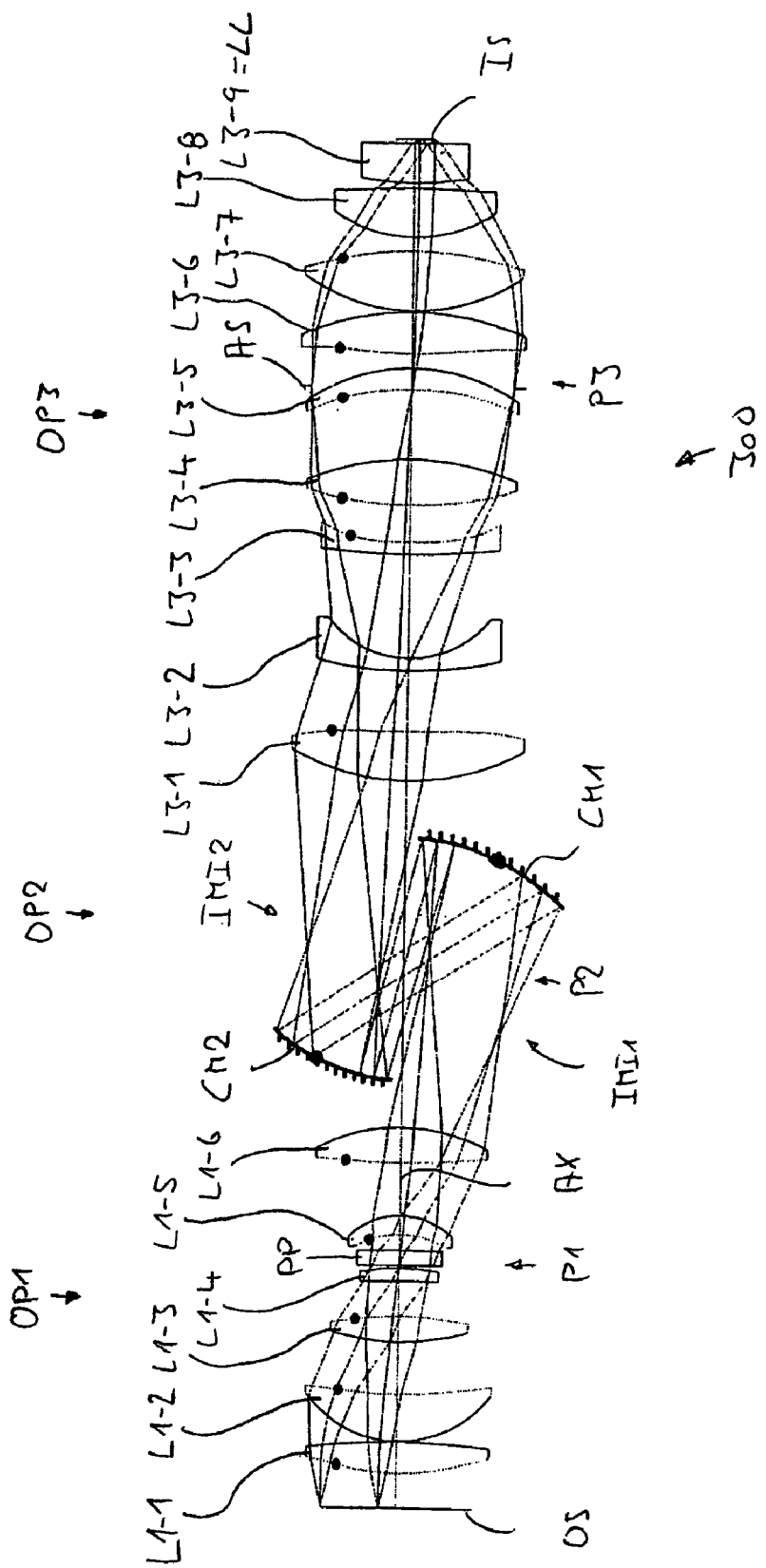
FIG. 3 shows a meridional lens section of a second embodiment of a catadioptric reduction projection objective according to the invention.

FIG. 3 shows a second embodiment of projection objective 300 designed as a dry objective for operating wavelength λ=248 nm, having NA=0.88 and image field size 26 mm*5.5 mm. The specification is given in tables 3, 3A.

Whereas the general layout is similar to the embodiment of FIG. 2, there are some remarkable differences. For example, the first objective part OP1, which has six lenses L1-1 to L1-6 and an additional plane plate PP adjacent to the first pupil surface P1, has positive lenses only, where three positive lenses L1-1, L1-3 and L1-6 are biconvex, thereby providing strong refractive power to collect the rays. The number of lenses is reduced to nine lenses in the third objective part OP3 such that the overall number of lenses is $N_L$=15. Biconvex positive lens L3-1 immediately following the second intermediate image IMI2 is the largest lens ($D_{max}$=187.55 mm). At Y'=15.83 the condition COMP=15.299 holds and $D_{max}$/NA=213.1 mm. A comparison with data for projection objective 200 reveals that a smaller maximum diameter may be obtained as the operating wavelength increases.

Figure 4:
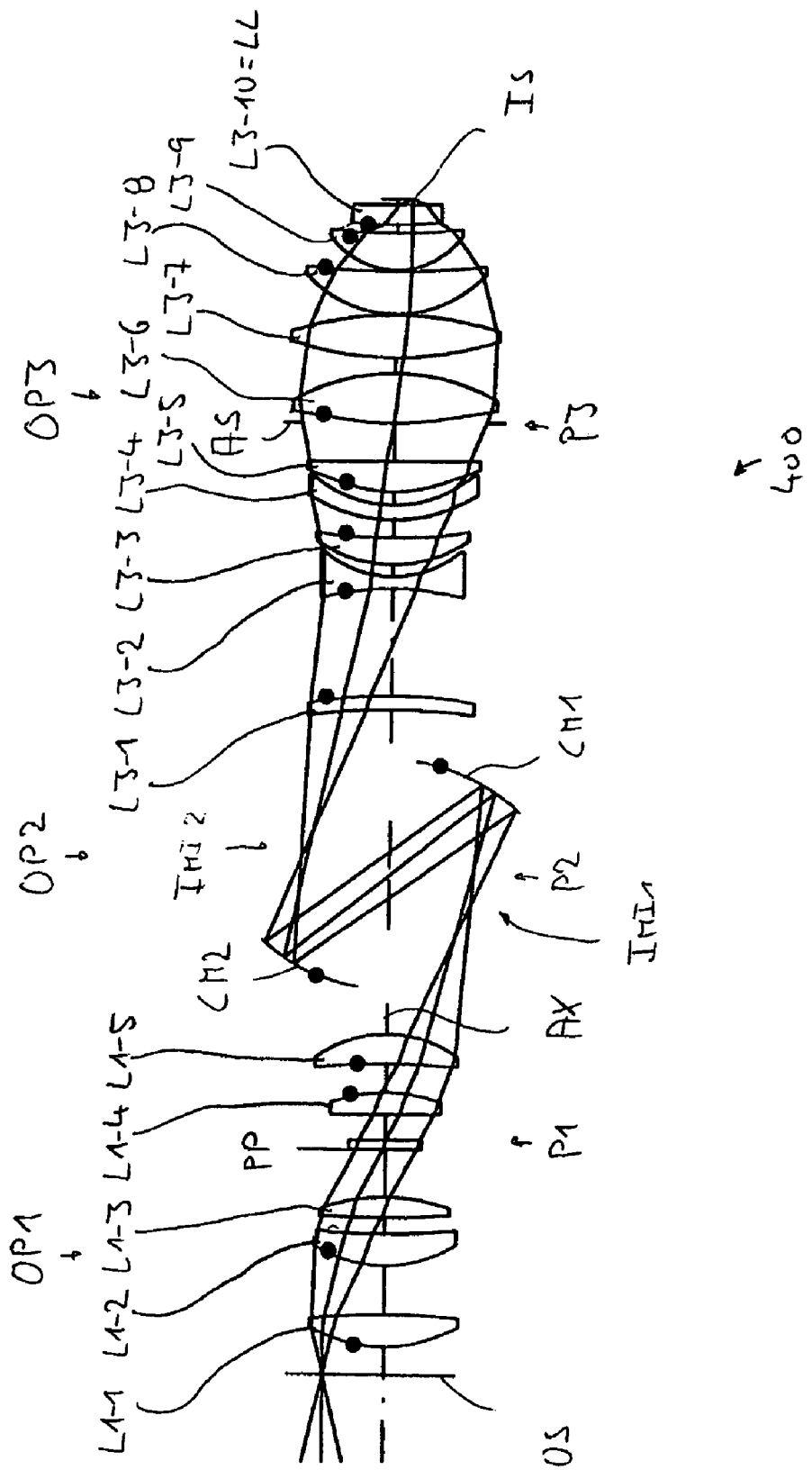
FIG. 4 shows an meridional lens section of a third embodiment of a catadioptric reduction projection objective according to the invention.

FIG. 4 shows a third embodiment of projection objective 400 designed as a dry objective for operating wavelength λ=248 nm, having NA=0.93 and image field size 26 mm*5.5 mm. The specification is given in tables 4, 4A.

The projection objective 400 has only five lenses (in addition to an optional plane parallel PP) in the first objective part OP1. Specifically, the first objective part OP1 has a biconvex positive lens L1-1 having an aspheric entrance surface immediately adjacent to the object surface OS, a positive meniscus lens L1-2 concave towards the image-side, a biconvex positive lens L1-3 following with a small air space, a parallel plate PP adjacent to the first pupil surface P1, a positive lens L1-4 having almost flat entrance surface and aspheric exit surface and a positive meniscus lens L1-5 concave and aspheric on the entrance side. All of these lenses L1-1 to L1-5 are positive lenses, including two biconvex lenses L1-1 and L1-3 and two meniscus lenses L1-2 and L1-5. The third objective part OP3 has ten lenses such that $N_L$=15. The largest lens is biconvex lens L3-7 with $D_{max}$=232.07 mm, whereby COMP=15.343 and $D_{max}$/NA=239.86 mm. Here, the largest lens L3-7 is provided between the aperture stop AS and the image surface in a lens group designed to Fourier transform the pupil surface P3 closest to the image surface (last pupil surface) of the projection objective onto the image surface, thereby contributing to forming the large image side NA.

Figure 5:
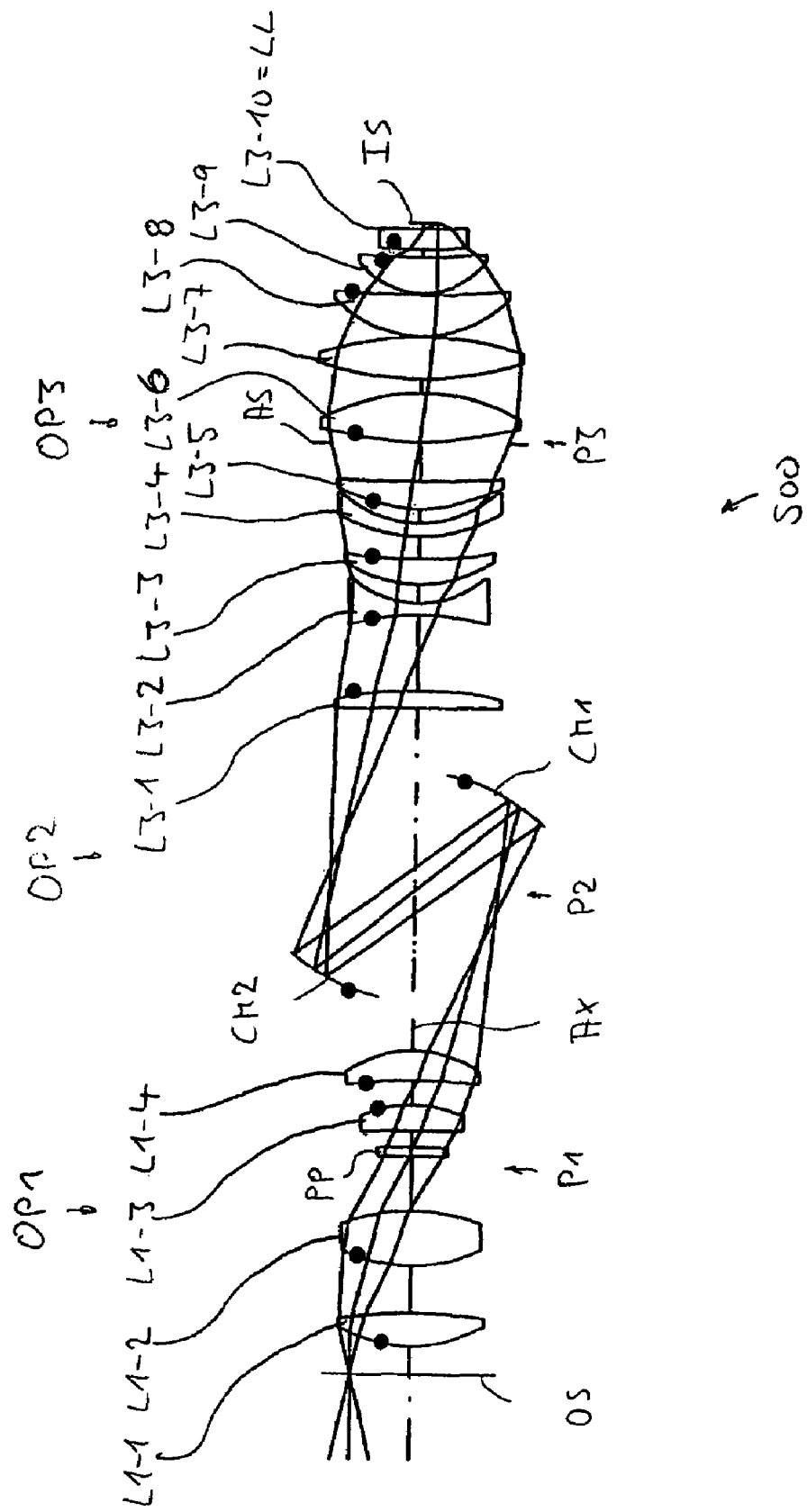
FIG. 5 shows a meridional lens section of a fourth embodiment of a catadioptric reduction projection objective according to the invention.

FIG. 5 shows a fourth embodiment of projection objective 500 designed as a dry objective for operating wavelength λ=248 nm, having NA=0.93 and image field size 26 mm*5.5 mm. The specification is given in tables 5, 5A.

A comparison between projection objective 400 and 500 shows that the number of lenses is further reduced in the first objective part OP1. Projection objective 500 may be derived from projection objective 400 by combining the optical action of lenses L1-2 and L1-3 of projection objective 400 to form a single, relatively thick biconvex lens L1-2 in projection objective 500. Corresponding adjustments to surface shape and position are made predominantly in the other lenses of the first objective part. The optimization reduces the number of lenses to four positive lenses in objective part OP1, such that $N_L$=14.

Figure 6:
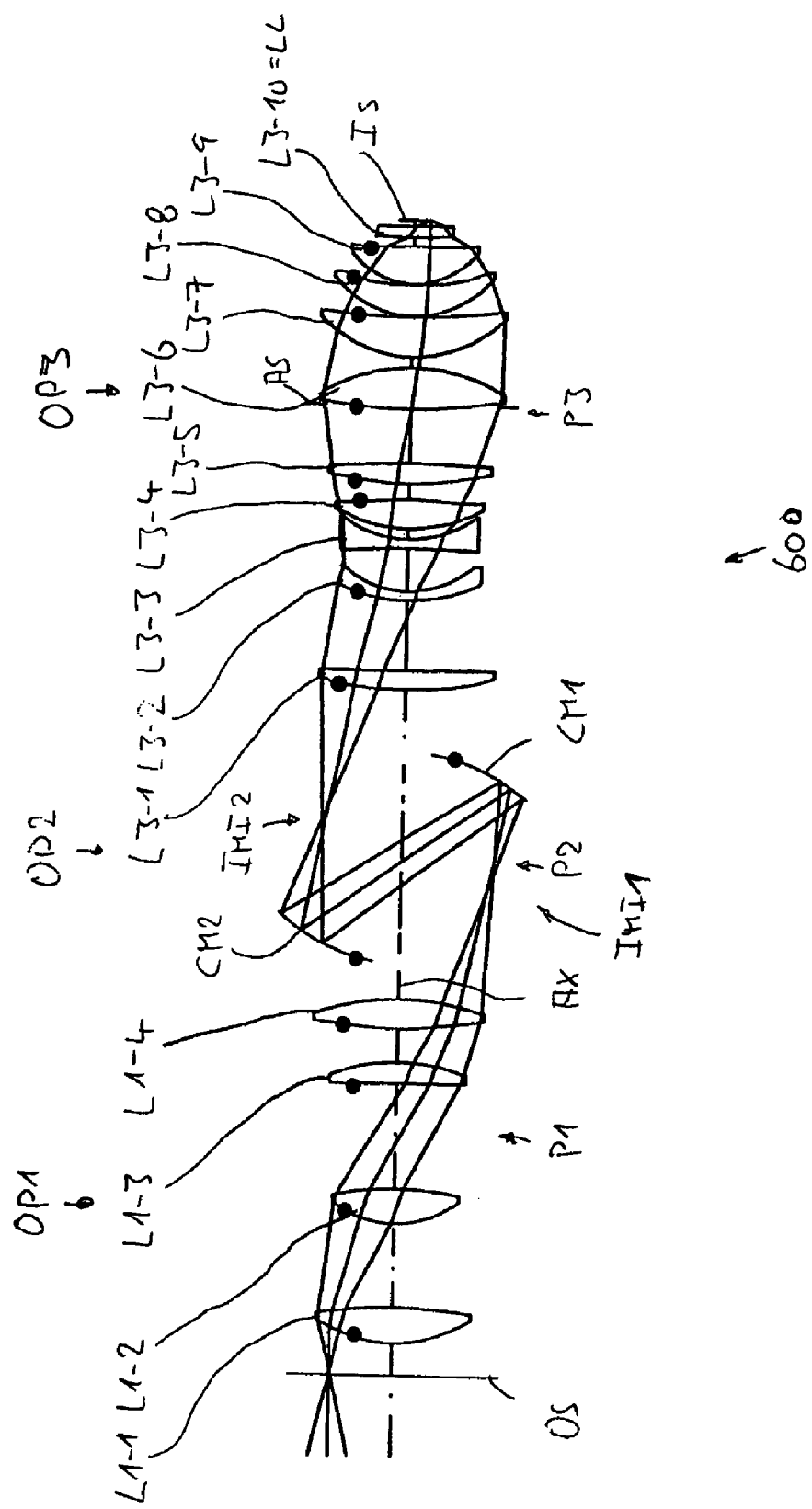
FIG. 6 shows a meridional lens section of a fifth embodiment of a catadioptric reduction projection objective according to the invention.

FIG. 6 shows a fifth embodiment of projection objective 600 designed as a dry objective for operating wavelength λ=248 nm, having NA=0.93 and image field size 26 mm*5.5 mm. The specification is given in tables 6, 6A.

The projection objective 600 in FIG. 6 has a first objective part OP1 formed by only four positive lenses L1-1 to L1-4, including three biconvex positive lenses and one positive meniscus lens L1-3 having almost flat entry surface. An optional parallel plate PP to be placed close to the first pupil surface P1 is not used, such that the number of optical surfaces is reduced by two surfaces with respect to the embodiment of FIG. 5. The largest lens (lens with maximum lens diameter $D_{max}$) is positive meniscus lens L3-7 concave on the image-side and forming the first of three positive meniscus lenses L3-7 to L3-9 concave and aspherical on their exit sides facing the image surface. The last optical element LL is a relatively flat plano-convex lens L3-10 having a spherical entry surface with large radius of curvature. The image-side working distance is about 6 mm.

Some of the remarkable features of the embodiments given above are summarized in Table 7, which indicates that reduction projection objectives with NA between about 0.80 and 0.95 have been designed which are very compact in the radial direction and which have relatively small overall numbers of lenses. This allows to fabricate the projection objectives relatively small in size with relatively low material consumption, yielding high performance, light weight, compact reduction projection objectives for dry lithography, where the projection objective is adapted with regard to aberrations to a gaseous medium with refractive index n'≈1 filling an image space of finite thickness between the exit surface of the projection objective and the image surface. The thickness of the finite gap may be substantially greater than the operating wavelength. The thickness may be in the order of one millimeter or a few millimeters, such as about 2 mm or about 3 mm or about 4 mm or about 5 mm or about 6 mm. The thickness may range between about 1 mm and about 10 mm, for example.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The content of all the claims is made part of this description by reference.

TABLE 2

| | NA = 0.88; λ = 193 nm; image field size 26 mm * 5.5 mm | | | | |
|---|---|---|---|---|---|
| SURFACE | RADIUS | | DISTANCE | INDEX | ½ DIAMETER |
| 0 | 0.000000 | | 27.977638 | 1.00030962 | 63.308 |
| 1 | 140.089175 | AS | 23.529200 REFR | 1.56078570 | 74.100 |
| 2 | 545.316991 | | 0.888012 REFR | 1.00030755 | 73.653 |
| 3 | 119.045269 | | 33.235602 REFR | 1.56078570 | 73.621 |
| 4 | 1232.447061 | AS | 39.100199 REFR | 1.00030755 | 71.226 |
| 5 | −134.650845 | | 9.966900 REFR | 1.56078570 | 60.862 |
| 6 | −136.275574 | AS | 19.499385 REFR | 1.00030755 | 60.236 |
| 7 | 165.725940 | | 36.104994 REFR | 1.56078570 | 47.508 |
| 8 | −220.045657 | | 0.906809 REFR | 1.00030755 | 39.369 |
| 9 | 0.000000 | | 9.997789 REFR | 1.56078570 | 36.049 |
| 10 | 0.000000 | | 17.274714 REFR | 1.00030755 | 31.905 |
| 11 | −67.201071 | AS | 18.230813 REFR | 1.56078570 | 29.447 |
| 12 | −57.898764 | | 80.225554 REFR | 1.00030755 | 36.154 |
| 13 | −2193.890924 | AS | 28.825413 REFR | 1.56078570 | 72.885 |
| 14 | −143.582093 | | 250.635774 REFR | 1.00030755 | 75.288 |
| 15 | −181.189015 | AS | −212.635830 REFL | 1.00030755 | 133.676 |
| 16 | 173.327901 | AS | 250.853540 REFL | 1.00030755 | 110.127 |
| 17 | 355.735738 | | 23.154206 REFR | 1.56078570 | 95.699 |
| 18 | −4328.648384 | | 36.092795 REFR | 1.00030755 | 95.140 |
| 19 | −5672.528472 | | 23.118809 REFR | 1.56078570 | 91.137 |
| 20 | −386.940019 | AS | 24.274754 REFR | 1.00030755 | 90.558 |
| 21 | −3616.693894 | | 9.993821 REFR | 1.56078570 | 76.765 |
| 22 | 116.828209 | | 70.646015 REFR | 1.00030755 | 69.545 |
| 23 | 205.134309 | | 9.992160 REFR | 1.56078570 | 73.528 |
| 24 | 116.441331 | | 27.385632 REFR | 1.00030755 | 71.529 |
| 25 | 548.193111 | | 11.486634 REFR | 1.56078570 | 74.229 |
| 26 | −2851.714358 | AS | 26.988613 REFR | 1.00030755 | 75.644 |
| 27 | 710.426063 | AS | 41.460934 REFR | 1.56078570 | 86.614 |
| 28 | −156.408830 | | 28.071603 REFR | 1.00030755 | 88.741 |
| 29 | −483.572849 | AS | 13.049575 REFR | 1.56078570 | 85.821 |
| 30 | −409.505826 | | 17.319499 REFR | 1.00030755 | 85.681 |
| 31 | 0.000000 | | 0.000000 REFR | 1.00030755 | 81.773 |
| 32 | 0.000000 | | 23.998179 REFR | 1.00030755 | 81.773 |
| 33 | 1194.460204 | AS | 36.975893 REFR | 1.56078570 | 84.114 |
| 34 | −292.418972 | | 0.882859 REFR | 1.00030755 | 86.382 |
| 35 | 167.953296 | | 40.939527 REFR | 1.56078570 | 85.403 |
| 36 | −369.620093 | AS | 12.976496 REFR | 1.00030755 | 83.421 |
| 37 | 93.156266 | | 43.779046 REFR | 1.56078570 | 61.592 |
| 38 | 142.461407 | | 1.392773 REFR | 1.00030755 | 44.592 |
| 39 | 93.363664 | | 38.406433 REFR | 1.56078570 | 41.390 |
| 40 | 0.000000 | | 2.997333 REFR | 1.00000000 | 21.566 |
| 41 | 0.000000 | | 0.000000 | 1.00000000 | 15.827 |

TABLE 2A

ASPHERIC COEFFICIENTS

| SRF | 1 | 4 | 6 | 11 | 13 |
|---|---|---|---|---|---|
| K | 0 | 0 | 0 | 0 | 0 |
| C1 | −3.337468e−08 | 2.015443e−10 | 1.777029e−07 | −3.055182e−07 | −7.507468e−09 |
| C2 | −3.399588e−12 | −7.979231e−12 | −2.462570e−11 | −8.355432e−12 | −5.664467e−13 |
| C3 | −2.464015e−16 | 4.148792e−16 | 5.126157e−15 | −1.046272e−13 | 1.996595e−17 |
| C4 | 6.375750e−20 | 5.568219e−20 | −8.673737e−19 | −5.078031e−17 | 5.926282e−22 |
| C5 | −9.706560e−24 | −1.735181e−23 | 1.982444e−22 | −6.526997e−20 | −1.623502e−24 |
| C6 | 2.378887e−28 | 1.417483e−27 | −3.995420e−26 | 4.159226e−22 | 4.799417e−28 |
| C7 | 1.221733e−31 | −1.614654e−31 | 5.260334e−30 | −7.692025e−25 | −6.248722e−32 |
| C8 | −1.343013e−35 | 9.258304e−36 | −3.080224e−34 | 6.357633e−28 | 3.110691e−36 |
| C9 | 0.000000e+00 | 0.000000e+00 | 0.000000e+00 | 0.000000e+00 | 0.000000e+00 |

| SRF | 15 | 16 | 20 | 26 | 27 |
|---|---|---|---|---|---|
| K | −1.8958 | −1.9651 | 0 | 0 | 0 |
| C1 | −2.817209e−08 | 3.776871e−08 | −9.233465e−08 | 6.058676e−08 | −7.604630e−08 |
| C2 | 2.248333e−13 | −2.236125e−13 | 4.802463e−12 | 8.476259e−12 | 4.770431e−12 |
| C3 | −4.586885e−18 | 9.462718e−18 | −8.915701e−17 | −1.492301e−16 | −9.555685e−17 |
| C4 | 1.074326e−22 | −1.830924e−22 | −1.391007e−20 | 1.288412e−20 | 1.933351e−20 |
| C5 | −1.865351e−27 | 1.158004e−26 | 2.106945e−24 | 5.911736e−24 | 3.560822e−24 |
| C6 | −4.282553e−32 | −6.452373e−31 | −1.424979e−28 | −1.230619e−27 | −6.884394e−28 |
| C7 | 3.348244e−36 | 2.495573e−35 | 4.599107e−33 | 1.121712e−31 | 5.435094e−32 |
| C8 | −5.809257e−41 | −3.848186e−40 | −4.465801e−38 | −5.366187e−36 | −1.976692e−36 |
| C9 | 0.000000e+00 | 0.000000e+00 | 0.000000e+00 | 0.000000e+00 | 0.000000e+00 |

| SRF | 29 | 33 | 36 |
|---|---|---|---|
| K | 0 | 0 | 0 |
| C1 | 3.412460e−08 | −5.960201e−08 | 3.902173e−09 |
| C2 | 3.234423e−12 | −2.375039e−12 | 1.814755e−12 |
| C3 | −3.481294e−17 | 2.177173e−16 | −3.743468e−17 |
| C4 | −2.382343e−20 | −1.693488e−20 | 3.716037e−20 |
| C5 | 3.761923e−24 | 4.073215e−24 | −9.308494e−24 |
| C6 | −8.013066e−28 | −5.815734e−28 | 1.435291e−27 |
| C7 | 8.612802e−32 | 4.841985e−32 | −1.117196e−31 |
| C8 | −4.109243e−36 | −1.350500e−36 | 3.737102e−36 |
| C9 | 0.000000e+00 | 0.000000e+00 | 0.000000e+00 |

TABLE 3

NA = 0.88; λ = 248 nm; image field size 26 mm * 5.5 mm

| SURFACE | RADIUS | | DISTANCE | | INDEX | ½ DIAMETER |
|---|---|---|---|---|---|---|
| 0 | 0.000000 | | 27.993656 | | 1.00028790 | 63.308 |
| 1 | 178.289844 | AS | 24.610803 | REFR | 1.50885281 | 72.259 |
| 2 | −681.760691 | | 0.900693 | REFR | 1.00028733 | 72.845 |
| 3 | 100.426420 | | 36.384068 | REFR | 1.50885281 | 74.502 |
| 4 | 298.295809 | AS | 41.972934 | REFR | 1.00028733 | 71.723 |
| 5 | 214.887957 | | 19.935484 | REFR | 1.50885281 | 54.173 |
| 6 | −249.697231 | AS | 28.342454 | REFR | 1.00028733 | 50.983 |
| 7 | −1661.355008 | | 10.591073 | REFR | 1.50885281 | 29.078 |
| 8 | −176.227976 | | 2.142778 | REFR | 1.00028733 | 25.533 |
| 9 | 0.000000 | | 11.689074 | REFR | 1.50885281 | 27.819 |
| 10 | 0.000000 | | 12.836389 | REFR | 1.00028733 | 31.998 |
| 11 | −77.596780 | AS | 14.951875 | REFR | 1.50885281 | 34.747 |
| 12 | −62.911256 | | 42.304329 | REFR | 1.00028733 | 39.739 |
| 13 | 531.001072 | AS | 28.307615 | REFR | 1.50885281 | 66.097 |
| 14 | −153.995248 | | 235.273458 | REFR | 1.00028733 | 68.322 |
| 15 | −165.207289 | AS | −197.252386 | REFL | 1.00028733 | 128.856 |
| 16 | 158.832505 | AS | 243.785628 | REFL | 1.00028733 | 105.610 |
| 17 | 202.631407 | | 39.365768 | REFR | 1.50885281 | 93.772 |
| 18 | 873.098212 | AS | 48.894454 | REFR | 1.00028733 | 92.214 |
| 19 | 347.198900 | | 9.999173 | REFR | 1.50885281 | 73.354 |
| 20 | 87.319846 | | 84.271091 | REFR | 1.00028733 | 64.743 |
| 21 | 632.477408 | | 9.994172 | REFR | 1.50885281 | 70.797 |
| 22 | 377.173838 | AS | 29.654234 | REFR | 1.00028733 | 71.360 |
| 23 | 352.268176 | AS | 36.431729 | REFR | 1.50885281 | 82.977 |
| 24 | −230.592400 | | 55.701679 | REFR | 1.00028733 | 84.087 |
| 25 | −260.334546 | AS | 17.353840 | REFR | 1.50885281 | 83.668 |
| 26 | −157.845521 | | −15.139366 | REFR | 1.00028733 | 85.028 |
| 27 | 0.000000 | | 0.000000 | REFR | 1.00028733 | 84.131 |
| 28 | 0.000000 | | 27.308483 | REFR | 1.00028733 | 84.131 |

TABLE 3-continued

NA = 0.88; λ = 248 nm; image field size 26 mm * 5.5 mm

| SURFACE | RADIUS | | DISTANCE | | INDEX | ½ DIAMETER |
|---|---|---|---|---|---|---|
| 29 | 347.500601 | AS | 33.178055 | REFR | 1.50885281 | 88.826 |
| 30 | −236.933990 | | 1.175992 | REFR | 1.00028733 | 90.005 |
| 31 | 165.410013 | | 47.012299 | REFR | 1.50885281 | 88.102 |
| 32 | −245.858054 | AS | 11.157514 | REFR | 1.00028733 | 86.028 |
| 33 | 122.646957 | | 38.759199 | REFR | 1.50885281 | 64.064 |
| 34 | −763.915706 | | 4.414610 | REFR | 1.00028733 | 53.644 |
| 35 | 250.708610 | | 31.452149 | REFR | 1.50885281 | 41.493 |
| 36 | 0.000000 | | 2.988795 | REFR | 1.00000000 | 21.378 |
| 37 | 0.000000 | | 0.000000 | | 1.00000000 | 15.827 |

TABLE 3A

ASPHERIC COEFFICIENTS

| SRF | 1 | 4 | 6 | 11 | 13 |
|---|---|---|---|---|---|
| K  | 0 | 0 | 0 | 0 | 0 |
| C1 | −1.013340e−07 | −1.805365e−07 | 1.732170e−07 | 5.429374e−08 | −6.218034e−08 |
| C2 | −7.280531e−12 | −1.266605e−12 | −1.522384e−11 | −4.212568e−11 | 5.585587e−12 |
| C3 | −9.812826e−19 | 5.547501e−15 | 9.901511e−15 | 1.102493e−15 | −5.928061e−16 |
| C4 | 8.192670e−20 | −5.212794e−19 | −1.205558e−18 | 2.039852e−17 | 6.007444e−20 |
| C5 | 2.064159e−27 | −6.922750e−23 | −1.570001e−25 | −2.166975e−20 | −2.754957e−24 |
| C6 | −1.729440e−27 | 2.129476e−26 | 5.680177e−26 | 2.454615e−23 | −4.646480e−28 |
| C7 | 1.188020e−31 | −2.281660e−30 | −8.264173e−30 | −1.584523e−26 | 5.866760e−32 |
| C8 | 3.658840e−36 | 1.013444e−34 | 2.267240e−35 | 5.511277e−30 | 1.520682e−36 |
| C9 | 0.000000e+00 | 0.000000e+00 | 0.000000e+00 | 0.000000e+00 | 0.000000e+00 |

| SRF | 15 | 16 | 18 | 22 | 23 |
|---|---|---|---|---|---|
| K  | −1.8958 | −1.9651 | 0 | 0 | 0 |
| C1 | −3.726135e−08 | 5.055776e−08 | −1.604304e−07 | 2.212892e−07 | 2.447175e−08 |
| C2 | 3.574413e−13 | −3.282866e−13 | 4.010958e−12 | 8.544130e−12 | 1.705024e−12 |
| C3 | −8.813174e−18 | 2.599138e−17 | 3.483146e−17 | −1.590857e−18 | −2.712605e−18 |
| C4 | 2.471463e−22 | −2.414928e−21 | 3.267983e−20 | 1.009723e−20 | −3.989426e−22 |
| C5 | −4.600442e−27 | 3.581087e−25 | −5.811356e−24 | −1.413551e−23 | 2.825722e−27 |
| C6 | 1.550924e−31 | −3.283676e−29 | 4.006120e−28 | 1.080454e−27 | −7.377423e−29 |
| C7 | −9.540984e−36 | 1.671516e−33 | −1.131049e−32 | −3.813553e−34 | 3.684286e−32 |
| C8 | 2.614888e−40 | −3.529895e−38 | 3.905423e−38 | −1.079687e−35 | −2.354489e−36 |
| C9 | 0.000000e+00 | 0.000000e+00 | 0.000000e+00 | 0.000000e+00 | 0.000000e+00 |

| SRF | 25 | 29 | 32 |
|---|---|---|---|
| K  | 0 | 0 | 0 |
| C1 | −7.060545e−08 | −1.025495e−07 | 5.136146e−08 |
| C2 | 3.702343e−12 | −3.765481e−12 | −2.862786e−12 |
| C3 | −1.280940e−16 | 2.873668e−16 | 6.646002e−16 |
| C4 | −3.031034e−20 | 3.781176e−21 | −3.994538e−20 |
| C5 | 1.138504e−23 | −7.989377e−25 | −4.240319e−26 |
| C6 | −2.361647e−27 | 1.692286e−28 | 3.159697e−28 |
| C7 | 2.271448e−31 | −8.370228e−33 | −2.956769e−32 |
| C8 | −9.951115e−36 | −1.888129e−38 | 1.002795e−36 |
| C9 | 0.000000e+00 | 0.000000e+00 | 0.000000e+00 |

TABLE 4

NA = 0.93; λ = 248 nm; image field size 26 mm * 5.5 mm

| SURFACE | RADIUS | THICKNESS | INDEX | SEMI-DIAMETER |
|---|---|---|---|---|
| 0 | 0.000000 | 29.986195 | 1.00027668 | 67.222 |
| 1 | 149.922459 | 34.086280 | 1.50885281 | 78.966 |
| 2 | −784.270278 | 51.950461 | 1.00027978 | 79.068 |
| 3 | 149.979301 | 32.878812 | 1.50885281 | 76.209 |
| 4 | 819.125916 | 16.944406 | 1.00027978 | 72.87 |
| 5 | 1263.551394 | 21.730763 | 1.50885281 | 68.642 |
| 6 | −211.587111 | 50.699731 | 1.00027978 | 66.875 |
| 7 | 0.000000 | 10.000000 | 1.50885281 | 34.586 |
| 8 | 0.000000 | 26.457334 | 1.00027978 | 38.113 |
| 9 | 0.000000 | 23.601519 | 1.50885281 | 53.458 |
| 10 | −161.586497 | 29.995975 | 1.00027978 | 58.309 |
| 11 | −1016.389987 | 31.866192 | 1.50885281 | 72.535 |
| 12 | −134.838011 | 295.897212 | 1.00027978 | 75.718 |
| 13 | −193.286655 | −247.837681 | 1.00027978 | 139.087 |
| 14 | 201.931162 | 300.621309 | 1.00027978 | 135.989 |
| 15 | −700.328945 | 14.986938 | 1.50885281 | 88.321 |
| 16 | −1018.396325 | 114.737690 | 1.00027978 | 88.404 |
| 17 | −246.834147 | 12.524590 | 1.50885281 | 76.108 |

TABLE 4-continued

NA = 0.93; λ = 248 nm; image field size 26 mm * 5.5 mm

| SUR-FACE | RADIUS | THICKNESS | INDEX | SEMI-DIAMETER |
|---|---|---|---|---|
| 18 | 120.975890 | 12.589797 | 1.00027978 | 75.412 |
| 19 | 153.165899 | 28.213253 | 1.50885281 | 80.346 |
| 20 | 1321.089504 | 18.683286 | 1.00027978 | 81.066 |
| 21 | 181.243390 | 14.985901 | 1.50885281 | 89.929 |
| 22 | 139.358601 | 14.341275 | 1.00027978 | 88.859 |
| 23 | 149.963602 | 32.265972 | 1.50885281 | 90.776 |
| 24 | 0.000000 | 40.313882 | 1.00027978 | 92.261 |
| 25 | 0.000000 | 0.000000 | 1.00027978 | 101.229 |
| 26 | 0.000000 | 0.244240 | 1.00027978 | 101.229 |
| 27 | 313.570367 | 53.322899 | 1.50885281 | 106.159 |
| 28 | −232.251317 | 16.876802 | 1.00027978 | 108.96 |
| 29 | 394.931327 | 44.077785 | 1.50885281 | 111.534 |
| 30 | −392.133506 | 0.895466 | 1.00027978 | 110.684 |
| 31 | 138.259840 | 44.811796 | 1.50885281 | 95.524 |
| 32 | 1009.464498 | 0.899287 | 1.00027978 | 90.273 |
| 33 | 90.107012 | 40.313163 | 1.50885281 | 69.726 |
| 34 | 1003.425803 | 9.001107 | 1.00027978 | 60.883 |
| 35 | 620.749630 | 21.026881 | 1.50885281 | 47.156 |
| 36 | 0.000000 | 6.009731 | 1.00027668 | 32.021 |
| 37 | 0.000000 | 0.000000 | 1.00027668 | 16.806 |

TABLE 5

NA = 0.93; λ = 248 nm; image field size 26 mm * 5.5 mm

| SUR-FACE | RADIUS | THICKNESS | INDEX | SEMI-DIAMETER |
|---|---|---|---|---|
| 0 | 0.000000 | 29.972121 | 1.00027668 | 67.222 |
| 1 | 147.803337 | 35.485252 | 1.50885281 | 78.994 |
| 2 | −571.188187 | 51.317524 | 1.00027978 | 79.127 |
| 3 | 188.719931 | 59.097078 | 1.50885281 | 75.302 |
| 4 | −226.802920 | 59.468426 | 1.00027978 | 69.199 |
| 5 | 0.000000 | 9.998803 | 1.50885281 | 34.359 |
| 6 | 0.000000 | 17.515252 | 1.00027978 | 38.056 |
| 7 | 0.000000 | 28.466552 | 1.50885281 | 48.807 |
| 8 | −147.739050 | 26.125996 | 1.00027978 | 55.383 |
| 9 | −1048.331962 | 33.001195 | 1.50885281 | 67.698 |
| 10 | −131.707776 | 301.360434 | 1.00027978 | 71.953 |
| 11 | −193.043299 | −246.976569 | −1.00027978 | 139.495 |
| 12 | 200.420470 | 317.758583 | 1.00027978 | 134.594 |
| 13 | 0.000000 | 18.729825 | 1.50885281 | 90.776 |
| 14 | −1168.015804 | 83.178298 | 1.00027978 | 90.613 |
| 15 | −235.511887 | 12.437317 | 1.50885281 | 76.367 |
| 16 | 118.010449 | 20.113335 | 1.00027978 | 74.034 |
| 17 | 156.417334 | 27.426392 | 1.50885281 | 81.505 |
| 18 | 1048.078613 | 24.331815 | 1.00027978 | 81.812 |
| 19 | 183.613126 | 14.319023 | 1.50885281 | 89.439 |
| 20 | 132.889119 | 15.380728 | 1.00027978 | 87.707 |

TABLE 4A

Aspheric coefficients

| SRF | 1 | 3 | 10 | 11 | 13 |
|---|---|---|---|---|---|
| K | 0 | 0 | 0 | 0 | −2.4049 |
| C1 | −4.559226E−08 | −7.050227E−08 | 1.210136E−08 | −5.209110E−08 | −3.396628E−08 |
| C2 | −6.246606E−12 | 1.206752E−11 | 2.627371E−11 | 1.020527E−11 | 3.968834E−13 |
| C3 | −7.444491E−16 | 6.731721E−16 | −1.160841E−15 | −9.326874E−16 | −1.333796E−17 |
| C4 | 3.650467E−19 | −5.157906E−19 | 4.279919E−19 | 1.946309E−19 | 3.815884E−22 |
| C5 | −8.653845E−23 | 9.733057E−23 | −2.821091E−22 | −5.852418E−23 | −8.887857E−27 |
| C6 | 1.160110E−26 | −1.260203E−26 | 8.711319E−26 | 1.098670E−26 | −1.229535E−31 |
| C7 | −8.620635E−31 | 9.907710E−31 | −1.427979E−29 | −1.111003E−30 | 2.072256E−35 |
| C8 | 2.863131E−35 | −3.373366E−35 | 1.056671E−33 | 4.687851E−35 | −7.159465E−40 |
| C9 | −1.375603E−40 | 1.208050E−41 | 2.456981E−40 | 9.271101E−41 | 9.486481E−45 |

| SRF | 14 | 16 | 17 | 20 | 23 |
|---|---|---|---|---|---|
| K | −3.0899 | 0 | 0 | 0 | 0 |
| C1 | 4.212139E−08 | −1.000788E−07 | 8.842431E−08 | 2.548766E−08 | −1.474232E−07 |
| C2 | −7.301955E−13 | 6.085616E−12 | 3.312131E−12 | 1.210836E−11 | 4.134025E−12 |
| C3 | 2.708210E−17 | 4.538498E−17 | 1.746963E−16 | −3.467364E−16 | −4.072025E−16 |
| C4 | −9.727229E−22 | −7.814499E−20 | −1.025055E−19 | −5.961816E−20 | 2.673737E−20 |
| C5 | 4.210426E−26 | 1.308987E−23 | −1.125301E−23 | 1.784902E−23 | −1.211480E−24 |
| C6 | −1.838608E−30 | −1.284797E−27 | 4.952810E−27 | −3.592801E−27 | −1.634273E−29 |
| C7 | 6.536089E−35 | 6.767438E−32 | −5.916884E−31 | 3.565312E−31 | 6.343773E−33 |
| C8 | −1.468220E−39 | −1.454082E−36 | 2.496208E−35 | −1.460502E−35 | −3.638258E−37 |
| C9 | 1.477358E−44 | −4.303702E−43 | 1.099596E−41 | −1.467037E−40 | 0.000000E+00 |

| SRF | 27 | 32 | 34 | 35 |
|---|---|---|---|---|
| K | 0 | 0 | 0 | 0 |
| C1 | −6.791332E−08 | −1.438493E−08 | 1.161704E−07 | −4.979357E−08 |
| C2 | 2.063536E−12 | 3.984930E−12 | −3.242675E−11 | −1.378486E−11 |
| C3 | −4.942195E−17 | −5.949437E−17 | 1.759943E−14 | 4.642909E−14 |
| C4 | 1.545892E−21 | −3.852229E−20 | −6.057845E−18 | −4.010686E−17 |
| C5 | 5.108905E−26 | 6.092745E−24 | 1.500820E−21 | 2.213739E−20 |
| C6 | −1.901206E−29 | −5.713066E−28 | −2.428880E−25 | −7.674658E−24 |
| C7 | 1.427147E−33 | 3.756778E−32 | 2.264283E−29 | 1.525848E−27 |
| C8 | −3.732233E−38 | −1.405608E−36 | −8.706226E−34 | −1.316022E−31 |
| C9 | 1.894764E−43 | 3.149009E−41 | 1.705969E−39 | −1.657288E−39 |

TABLE 5-continued

NA = 0.93; λ = 248 nm; image field size 26 mm * 5.5 mm

| SURFACE | RADIUS | THICKNESS | INDEX | SEMI-DIAMETER |
|---|---|---|---|---|
| 21 | 149.726970 | 29.849904 | 1.50885281 | 89.526 |
| 22 | 1872.612222 | 41.212528 | 1.00027978 | 90.825 |
| 23 | 0.000000 | 0.000000 | 1.00027978 | 99.526 |
| 24 | 0.000000 | 1.111259 | 1.00027978 | 99.539 |
| 25 | 282.464712 | 53.111851 | 1.50885281 | 105.67 |
| 26 | −235.521111 | 15.503277 | 1.00027978 | 108.369 |
| 27 | 377.626280 | 44.821822 | 1.50885281 | 111.422 |
| 28 | −389.155432 | 0.899595 | 1.00027978 | 110.592 |
| 29 | 139.600331 | 45.268726 | 1.50885281 | 95.562 |
| 30 | 1041.962917 | 1.321489 | 1.00027978 | 90.332 |
| 31 | 90.691308 | 39.162241 | 1.50885281 | 69.138 |
| 32 | 1052.604578 | 8.362156 | 1.00027978 | 60.186 |
| 33 | 561.732623 | 22.249931 | 1.50885281 | 47.908 |
| 34 | 0.000000 | 6.002451 | 1.00027668 | 32.027 |
| 35 | 0.000000 | 0.000000 | 1.00027668 | 16.806 |

TABLE 6

NA = 0.93; λ = 248 nm; image field size 26 mm * 5.5 mm

| SURFACE | RADIUS | THICKNESS | INDEX | SEMI-DIAMETER |
|---|---|---|---|---|
| 0 | 0.000000 | 30.901316 | 1.00000000 | 71.000 |
| 1 | 149.920479 | 38.422445 | 1.50883663 | 83.988 |
| 2 | −578.316992 | 90.596786 | 1.00000000 | 83.715 |
| 3 | 122.491964 | 37.028001 | 1.50883663 | 69.252 |
| 4 | −365.148347 | 114.220033 | 1.00000000 | 66.592 |
| 5 | −1163.634007 | 22.633824 | 1.50883663 | 71.490 |
| 6 | −204.646433 | 36.744269 | 1.00000000 | 74.427 |
| 7 | 369.656178 | 31.839971 | 1.50883663 | 91.533 |
| 8 | −290.059999 | 271.840829 | 1.00000000 | 92.905 |
| 9 | −189.274827 | −231.841456 | −1.00000000 | 134.303 |
| 10 | 192.854420 | 299.245656 | 1.00000000 | 134.892 |
| 11 | 727.130430 | 19.937099 | 1.50883663 | 95.415 |
| 12 | 7759.885076 | 76.668783 | 1.00000000 | 94.426 |
| 13 | 227.968858 | 9.628390 | 1.50883663 | 79.534 |
| 14 | 113.851478 | 47.532961 | 1.00000000 | 74.309 |
| 15 | −1018.433971 | 9.628390 | 1.50883663 | 74.643 |

TABLE 5A

Aspheric coefficients

| SRF | 1 | 3 | 8 | 9 | 11 |
|---|---|---|---|---|---|
| K | 0 | 0 | 0 | 0 | −2.6650 |
| C1 | −4.765749E−08 | −7.623348E−08 | −9.387015E−08 | −1.241946E−07 | −3.873638E−08 |
| C2 | −8.218163E−12 | 1.573568E−11 | 4.263675E−11 | 1.966512E−11 | 5.778638E−13 |
| C3 | −8.134791E−17 | 1.031316E−15 | −5.554306E−15 | −2.576798E−15 | −1.849344E−17 |
| C4 | 1.248451E−19 | −6.049607E−19 | 2.660821E−18 | 6.108190E−19 | 4.263685E−22 |
| C5 | −3.153048E−23 | 9.713372E−23 | −1.284895E−21 | −1.586207E−22 | −1.100943E−27 |
| C6 | 3.902885E−27 | −9.301156E−27 | 3.811302E−25 | 2.810091E−26 | −6.637036E−31 |
| C7 | −2.544360E−31 | 4.963191E−31 | −6.502169E−29 | −2.915380E−30 | 3.741405E−35 |
| C8 | 7.932368E−36 | −1.050853E−35 | 5.019672E−33 | 1.348525E−34 | −9.272380E−40 |
| C9 | −1.375603E−40 | 1.208050E−41 | 2.456981E−40 | 9.271101E−41 | 9.486481E−45 |

| SRF | 12 | 14 | 15 | 18 | 21 |
|---|---|---|---|---|---|
| K | −3.0101 | 0 | 0 | 0 | 0 |
| C1 | 4.182799E−08 | −1.302614E−07 | 6.279527E−08 | 2.098187E−08 | −1.328856E−07 |
| C2 | −6.944052E−13 | 7.655813E−12 | 6.495397E−12 | 1.067574E−11 | 1.823701E−12 |
| C3 | 2.505459E−17 | 1.109061E−16 | 8.889379E−16 | −1.765616E−17 | −7.414105E−17 |
| C4 | −8.246584E−22 | −9.878370E−20 | −3.638499E−19 | −1.028969E−19 | −1.757747E−20 |
| C5 | 3.254155E−26 | 1.327221E−23 | 2.298801E−23 | 1.430711E−23 | 4.279453E−24 |
| C6 | −1.406847E−30 | −1.037554E−27 | 3.001304E−27 | −1.811678E−27 | −5.673140E−28 |
| C7 | 5.400646E−35 | 4.390276E−32 | −5.691668E−31 | 1.412795E−31 | 4.253405E−32 |
| C8 | −1.338142E−39 | −7.443123E−37 | 2.596480E−35 | −4.249741E−36 | −1.520295E−36 |
| C9 | 1.477358E−44 | −4.303702E−43 | 1.099596E−41 | −1.467037E−40 | 0.000000E+00 |

| SRF | 25 | 30 | 32 | 33 |
|---|---|---|---|---|
| K | 0 | 0 | 0 | 0 |
| C1 | −7.795757E−08 | −2.638188E−08 | 1.836642E−07 | −3.242155E−09 |
| C2 | 2.399669E−12 | 3.101003E−12 | −5.313905E−11 | −6.777781E−11 |
| C3 | −7.237294E−17 | 2.043998E−16 | 2.376698E−14 | 8.626941E−14 |
| C4 | 3.301936E−21 | −8.811706E−20 | −7.263809E−18 | −6.268981E−17 |
| C5 | 3.896123E−27 | 1.401317E−23 | 1.490149E−21 | 3.113394E−20 |
| C6 | −2.286585E−29 | −1.376981E−27 | −1.726479E−25 | −1.004097E−23 |
| C7 | 1.970311E−33 | 9.036936E−32 | 5.220140E−30 | 1.901859E−27 |
| C8 | −5.851144E−38 | −3.143377E−36 | 7.620952E−34 | −1.572438E−31 |
| C9 | 1.894764E−43 | 3.149009E−41 | 1.705969E−39 | −1.657288E−39 |

TABLE 6-continued

NA = 0.93; λ = 248 nm; image field size 26 mm * 5.5 mm

| SURFACE | RADIUS | THICKNESS | INDEX | SEMI-DIAMETER |
|---|---|---|---|---|
| 16 | 132.707543 | 11.785259 | 1.00000000 | 76.009 |
| 17 | 179.558396 | 30.750846 | 1.50883663 | 79.928 |
| 18 | −425.287569 | 17.295746 | 1.00000000 | 81.095 |
| 19 | 299.408608 | 21.518244 | 1.50883663 | 88.054 |
| 20 | −1226.165475 | 62.369530 | 1.00000000 | 89.137 |
| 21 | 0.000000 | −3.528946 | 1.00000000 | 98.988 |
| 22 | 467.952710 | 44.807201 | 1.50883663 | 100.185 |
| 23 | −199.857887 | 11.488021 | 1.00000000 | 101.934 |
| 24 | 150.363314 | 42.689569 | 1.50883663 | 102.188 |
| 25 | 570.609514 | 0.962839 | 1.00000000 | 99.550 |
| 26 | 116.999435 | 34.428366 | 1.50883663 | 87.416 |
| 27 | 573.998796 | 0.962839 | 1.00000000 | 82.153 |
| 28 | 91.252244 | 41.370858 | 1.50883663 | 69.639 |
| 29 | −1151.144039 | 9.760223 | 1.00000000 | 62.263 |
| 30 | 656.557358 | 12.318202 | 1.50883663 | 41.515 |
| 31 | 0.000000 | 5.994084 | 1.00000000 | 32.904 |
| 32 | 0.000000 | 0.000000 | 1.00000000 | 17.751 |

TABLE 6A

Aspheric coefficients

| SRF | 1 | 3 | 5 | 7 | 9 |
|---|---|---|---|---|---|
| K | 0 | 0 | 0 | 0 | −2.6167 |
| C1 | −6.762930E−09 | 3.732337E−08 | 1.171681E−07 | −7.910034E−08 | −3.604252E−08 |
| C2 | −7.748509E−12 | 5.289331E−12 | −1.576050E−11 | 4.413449E−12 | 6.782923E−13 |
| C3 | 4.054607E−16 | −1.925725E−15 | 1.869337E−15 | −3.251609E−16 | −1.774337E−17 |
| C4 | −3.122735E−20 | −1.721183E−20 | −1.688065E−19 | 2.201171E−20 | 4.837747E−22 |
| C5 | 1.746552E−24 | −1.297192E−23 | 1.067051E−23 | −1.188676E−24 | −9.656882E−27 |
| C6 | −4.923829E−29 | 2.839540E−27 | −3.878726E−28 | 3.189439E−29 | 1.082032E−31 |
| C7 | 0.000000E+00 | 0.000000E+00 | 0.000000E+00 | 0.000000E+00 | 0.000000E+00 |
| C8 | 0.000000E+00 | 0.000000E+00 | 0.000000E+00 | 0.000000E+00 | 0.000000E+00 |
| C9 | 0.000000E+00 | 0.000000E+00 | 0.000000E+00 | 0.000000E+00 | 0.000000E+00 |

| SRF | 10 | 11 | 13 | 18 | 19 |
|---|---|---|---|---|---|
| K | −2.3253 | 0 | 0 | 0 | 0 |
| C1 | 3.521109E−08 | 5.052237E−08 | 8.763309E−08 | 9.925506E−08 | −4.056692E−08 |
| C2 | −2.971277E−13 | 7.105859E−13 | −2.661723E−12 | −7.663431E−13 | −5.292183E−12 |
| C3 | 1.006422E−17 | 1.078923E−16 | 3.709029E−16 | 7.576045E−16 | 5.885239E−16 |
| C4 | −1.742775E−22 | −1.210388E−20 | −9.517038E−20 | −8.502761E−20 | −7.919971E−20 |
| C5 | 3.373083E−27 | 1.393899E−24 | 7.795388E−24 | 8.168447E−24 | 6.557078E−24 |
| C6 | −1.880322E−32 | −6.045967E−29 | −6.641866E−28 | −4.240150E−28 | −2.549022E−28 |
| C7 | 0.000000E+00 | 0.000000E+00 | 0.000000E+00 | 0.000000E+00 | 0.000000E+00 |
| C8 | 0.000000E+00 | 0.000000E+00 | 0.000000E+00 | 0.000000E+00 | 0.000000E+00 |
| C9 | 0.000000E+00 | 0.000000E+00 | 0.000000E+00 | 0.000000E+00 | 0.000000E+00 |

| SRF | 22 | 25 | 27 | 29 |
|---|---|---|---|---|
| K | 0 | 0 | 0 | 0 |
| C1 | −3.081838E−08 | −3.899504E−08 | 2.010219E−07 | 7.978147E−08 |
| C2 | 1.483113E−13 | −1.805296E−12 | 4.081246E−12 | 8.072689E−12 |
| C3 | 2.771138E−17 | 4.816146E−16 | −1.251816E−15 | 1.163201E−15 |
| C4 | −3.894425E−21 | 1.843256E−20 | 1.106298E−19 | −3.316439E−19 |
| C5 | −6.907154E−26 | −5.040770E−24 | −2.248748E−23 | 6.119541E−23 |
| C6 | −2.905915E−30 | 1.926461E−28 | 1.261527E−27 | −3.890743E−27 |
| C7 | 0.000000E+00 | 0.000000E+00 | 0.000000E+00 | 0.000000E+00 |
| C8 | 0.000000E+00 | 0.000000E+00 | 0.000000E+00 | 0.000000E+00 |
| C9 | 0.000000E+00 | 0.000000E+00 | 0.000000E+00 | 0.000000E+00 |

TABLE 7

| Embodiment | Dmax [mm] | Y' [mm] | NA | n' | Dmax/NA [mm] | COMP |
|---|---|---|---|---|---|---|
| FIG. 2 | 191.40 | 15.83 | 0.88 | 1 | 217.499 | 15.613 |
| FIG. 3 | 187.55 | 15.83 | 0.88 | 1 | 213.121 | 15.299 |
| FIG. 4 | 223.07 | 16.81 | 0.93 | 1 | 239.858 | 15.343 |
| FIG. 5 | 222.84 | 16.81 | 0.93 | 1 | 237.617 | 15.327 |
| FIG. 6 | 204.38 | 17.75 | 0.93 | 1 | 219.759 | 13.313 |

What is claimed is:

1. A projection objective for projection lithography comprising:
    a plurality of optical elements configured to image an effective object field arranged in an object surface of the projection objective into an effective image field arranged in an image surface of the projection objective;
    the optical elements forming a dry objective adapted with regard to aberrations to a gaseous medium with refractive index n'<1.01 filling an image space of finite thickness between an exit surface of the projection objective and the image surface;
    the optical elements including a largest lens having a maximum lens diameter $D_{max}$;
    the optical elements being configured to provide an image-side numerical aperture NA<1 in an effective image field having a maximum image field height Y'; wherein
    a compactness parameter COMP is defined as COMP=$D_{max}/(Y'·(NA/n')^2)$
    and wherein the following condition holds:
    COMP<15.8.

2. Projection objective according to claim 1, wherein COMP <15.

3. Projection objective according to claim 1, wherein COMP <14.

4. Projection objective according to claim 1, wherein NA>0.8.

5. Projection objective according to claim 1, wherein NA>0.8 and $D_{max}$/NA <240 mm.

6. Projection objective according to claim 1, wherein the condition $N_L$<20 holds for the total number $N_L$ of lenses of the projection objective.

7. Projection objective according to claim 6, wherein $N_L$≦16.

8. Projection objective according to claim 1, wherein the projection objective has at least one intermediate image.

9. Projection objective according to claim 1, wherein the optical elements include at least one concave mirror to form a catadioptric projection objective.

10. Projection objective according to claim 9, wherein the projection objective has an even number of concave mirrors.

11. Projection objective according to claim 10, wherein the even number is two.

12. Projection objective according to claim 9, wherein the projection objective is an in-line system having one straight optical axis common to all optical elements.

13. Projection objective according to claim 9, wherein the projection objective has at least one intermediate image.

14. Projection objective according to claim 9, wherein the projection objective is designed to form a circular exit pupil without obscuration and centered about the optical axis.

15. Projection objective according to claim 9, wherein the projection objective is designed to image an off-axis effective object field arranged entirely outside an optical axis into an off-axis image field arranged entirely outside the optical axis.

16. Projection objective according to claim 1, wherein the projection objective is an in-line system having one straight optical axis common to all optical elements.

17. Projection objective according to claim 1, wherein the projection objective comprises:
    a first, refractive objective part for imaging a pattern provided in the object surface into a first intermediate image;
    a second objective part including at least one concave mirror for imaging the first intermediate image into a second intermediate image;
    a third, refractive objective part for imaging the second intermediate image onto the image surface.

18. Projection objective according to claim 17, wherein a first concave mirror having a first mirror surface and at least one second concave mirror having a second mirror surface are arranged in the second objective part;
    a first pupil surface is formed between the object surface and the first intermediate image,
    a second pupil surface is formed between the first and the second intermediate image,
    a third pupil surface is formed between the second intermediate image and the image surface; and
    all concave mirrors are arranged optically remote from each of the first, second, and third pupil surfaces.

19. Projection objective according to claim 17, wherein the first objective part and the second objective part and the third objective part share a common straight optical axis.

20. Projection objective according to claim 17, wherein the first objective part has exclusively lenses with positive refractive power.

21. Projection objective according to claim 17, wherein the first objective part has five or less lenses with positive refractive power.

22. Projection objective according to claim 17, wherein the first objective part has four lenses with positive refractive power and no lens with negative refractive power.

23. Projection objective according to claim 17, wherein the largest lens is arranged in the third objective part imaging the second intermediate image onto the image surface.

24. Projection objective according to claim 17, wherein the largest lens is arranged in a lens group between the second intermediate image and a pupil surface of the third objective part of the projection objective.

25. Projection objective according to claim 17, wherein the largest lens is positioned directly adjacent and downstream of the second intermediate image.

26. Projection objective according to claim 1, wherein the projection objective is designed at a reduction projection objective having reducing magnification ratio |β|<1.

27. Projection objective according to claim 26, wherein |β|≦0.25.

28. Projection objective according to claim 1, wherein the projection objective has a number $N_L$ of lenses, a number $N_{ASP}$ of aspheric lenses and the condition AR>0.33 holds for the asphere ratio AR=$N_{ASP}/N_L$.

29. A projection exposure apparatus for use in microlithography having an illumination system and a reduction projection objective, wherein the reduction projection objective is configured according to claim 1.

30. A method for fabricating semiconductor devices or other types of micro devices, the method comprising:
   providing a mask having a prescribed pattern;
   illuminating the mask with ultraviolet light having a prescribed wavelength; and
   projecting an image of the pattern onto a photosensitive substrate arranged in the vicinity of an image surface of a projection objective using a reduction projection objective according to claim 1.

31. A catadioptric projection objective for projection lithography comprising:
   a plurality of optical elements configured to image an effective object field arranged in an object surface of the projection objective into an effective image field arranged in an image surface of the projection objective;
   the optical elements forming a dry objective adapted with regard to aberrations to a gaseous medium with refractive index n'<1.01 filling an image space of finite thickness between an exit surface of the projection objective and the image surface;
   the optical elements forming:
   a first objective part configured to image a pattern provided in the object surface into a first intermediate image;
   a second objective part including at least one concave mirror configured to image the first intermediate image into a second intermediate image;
   a third objective part configured to image the second intermediate image onto the image surface; wherein:
   the projection objective has a maximum lens diameter $D_{max}$, a maximum image field height Y', and an image side numerical aperture NA<1; wherein
   a compactness parameter COMP is defined as COMP=$D_{max}/(Y'\cdot(NA/n')^2)$
   and wherein the following condition holds:
   COMP<18.

32. Projection objective according to claim 31, wherein NA>0.8.

33. Projection objective according to claim 31, wherein NA>0.8 and $D_{max}$/NA <240 mm.

34. Projection objective according to claim 31, wherein the condition $N_L$<20 holds for the total number $N_L$ of lenses of the projection objective.

35. Projection objective according to claim 34, wherein $N_L \leq 16$.

36. Projection objective according to claim 31, wherein the projection objective has an even number of concave mirrors.

37. Projection objective according to claim 36, wherein the even number is two.

38. Projection objective according to claim 31, wherein the projection objective is an in-line system having one straight optical axis common to all optical elements.

39. Projection objective according to claim 31, wherein a first concave mirror having a first mirror surface and at least one second concave mirror having a second mirror surface are arranged in the second objective part;
   a first pupil surface is formed between the object surface and the first intermediate image,
   a second pupil surface is formed between the first and the second intermediate image,
   a third pupil surface is formed between the second intermediate image and the image surface; and
   all concave mirrors are arranged optically remote from each of the first, second, and third pupil surfaces.

40. Projection objective according to claim 31, wherein the first objective part has exclusively lenses with positive refractive power.

41. Projection objective according to claim 31, wherein the first objective part has five or less lenses with positive refractive power.

42. Projection objective according to claim 31, wherein the first objective part has four lenses with positive refractive power and no lens with negative refractive power.

43. Projection objective according to claim 31, wherein a largest lens is arranged in the third objective part imaging the second intermediate image onto the image surface.

44. Projection objective according to claim 31, wherein a largest lens is arranged in a lens group between the second intermediate image and a pupil surface of the third objective part of the projection objective.

45. Projection objective according to claim 31, wherein a largest lens is positioned directly adjacent and downstream of the second intermediate image.

46. Projection objective according to claim 31, wherein the projection objective is designed to form a circular exit pupil without obscuration and centered about the optical axis.

47. Projection objective according to claim 31, wherein the projection objective is designed to image an off-axis effective object field arranged entirely outside an optical axis into an off-axis image field arranged entirely outside the optical axis.

48. Projection objective according to claim 31, wherein the projection objective is designed as a reduction projection objective having reducing magnification ratio $|\beta|<1$.

49. Projection objective according to claim 48, wherein $|\beta| \leq 0.25$.

50. Projection objective according to claim 31, wherein the projection objective has a number $N_L$ of lenses, a number $N_{ASP}$ of aspheric lenses and the condition AR>0.33 holds for the asphere ratio AR=$N_{ASP}/N_L$.

* * * * *